US011515311B2

(12) United States Patent
Neelapala et al.

(10) Patent No.: US 11,515,311 B2
(45) Date of Patent: Nov. 29, 2022

(54) SEMICONDUCTOR STRUCTURE FORMATION AT DIFFERENTIAL DEPTHS

(71) Applicant: Micron Technology, Inc., Boise, ID (US)

(72) Inventors: Venkata Naveen Kumar Neelapala, Hyderabad (IN); Deepak Chandra Pandey, Almora (IN); Naveen Kaushik, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 173 days.

(21) Appl. No.: 16/711,531

(22) Filed: Dec. 12, 2019

(65) Prior Publication Data

US 2021/0183865 A1 Jun. 17, 2021

(51) Int. Cl.
*H01L 27/108* (2006.01)
*H01L 29/423* (2006.01)

(52) U.S. Cl.
CPC .. *H01L 27/10823* (2013.01); *H01L 27/10808* (2013.01); *H01L 27/10876* (2013.01); *H01L 27/10891* (2013.01); *H01L 29/4236* (2013.01)

(58) Field of Classification Search
CPC ......... H01L 27/10823; H01L 27/10808; H01L 27/10876; H01L 29/4236
See application file for complete search history.

(56) References Cited

U.S. PATENT DOCUMENTS

| 7,662,693 B2 | 2/2010 | Bhattacharyya |
| 7,875,529 B2 | 1/2011 | Forbes et al. |
| 8,274,777 B2 | 9/2012 | Kiehlbauch |
| 2013/0115745 A1* | 5/2013 | Chung ............... H01L 27/10876 438/270 |
| 2013/0256770 A1* | 10/2013 | Huh ....................... H01L 29/785 257/296 |

(Continued)

OTHER PUBLICATIONS

Wu, et al., "Improved Tungsten Gap-Fill for Advanced Contact Metallization", 2016 IEEE International Interconnect Technology Conference/Advanced Metallization Conference (IITC/AMC), San Jose, CA, USA, May 23-26, 2016, pp. 171-173.

(Continued)

*Primary Examiner* — Phat X Cao
(74) *Attorney, Agent, or Firm* — Brooks, Cameron & Huebsch, PLLC

(57) ABSTRACT

Systems, apparatuses, and methods related to semiconductor structure formation are described. An example apparatus includes a first trench and a second trench formed in a semiconductor substrate material, where the first and second trenches are adjacent and separated by the semiconductor substrate material. The apparatus includes a metallic material formed to a first height in the first trench that is less than, relative to the semiconductor substrate material, a second height of the metallic material formed in the second trench and a polysilicon material formed over the metallic material in the first trench to a first depth greater than, relative to the semiconductor substrate material, a second depth of the polysilicon material formed over the metallic material in the second trench. The greater first depth of the polysilicon material formed in the first trench reduces transfer of charge by way of the metallic material in the first trench.

25 Claims, 15 Drawing Sheets

(56) References Cited

U.S. PATENT DOCUMENTS

2019/0067278 A1* 2/2019 Seo .................... H01L 27/0886

OTHER PUBLICATIONS

Applied Materials, "Centura® Isprint™ ALD/CVD SSW," (3 pages), retrieved from: http://www.appliedmaterials.com/products/centura-isprint-ssw-cvd.
Applied Materials, "Endura® Volta™ CVD W," (4 pages), retrieved from: http://www.appliedmaterials.com/products/endura-volta-w-cvd.
Applied Materials, "Reducing yield loss with seam-suppressed tungsten contact gap fill," Jun. 24, 2016, (4 pages), iTERS News, retrieved from: http://itersnews.com/?p=103327.

* cited by examiner

SEMICONDUCTOR STRUCTURE FORMATION AT DIFFERENTIAL DEPTHS

TECHNICAL FIELD

The present disclosure relates generally to semiconductor devices and methods, and more particularly to semiconductor structure formation.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory (e.g., NAND, NOR, etc.), among others. Some types of memory devices may be non-volatile memory (e.g., ReRAM, NAND) and may be used for a wide range of electronic applications in need of high memory densities, high reliability, and low power consumption. Volatile memory cells (e.g., DRAM cells) require power to retain their stored data state (e.g., via a refresh process to compensate for loss of charge), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
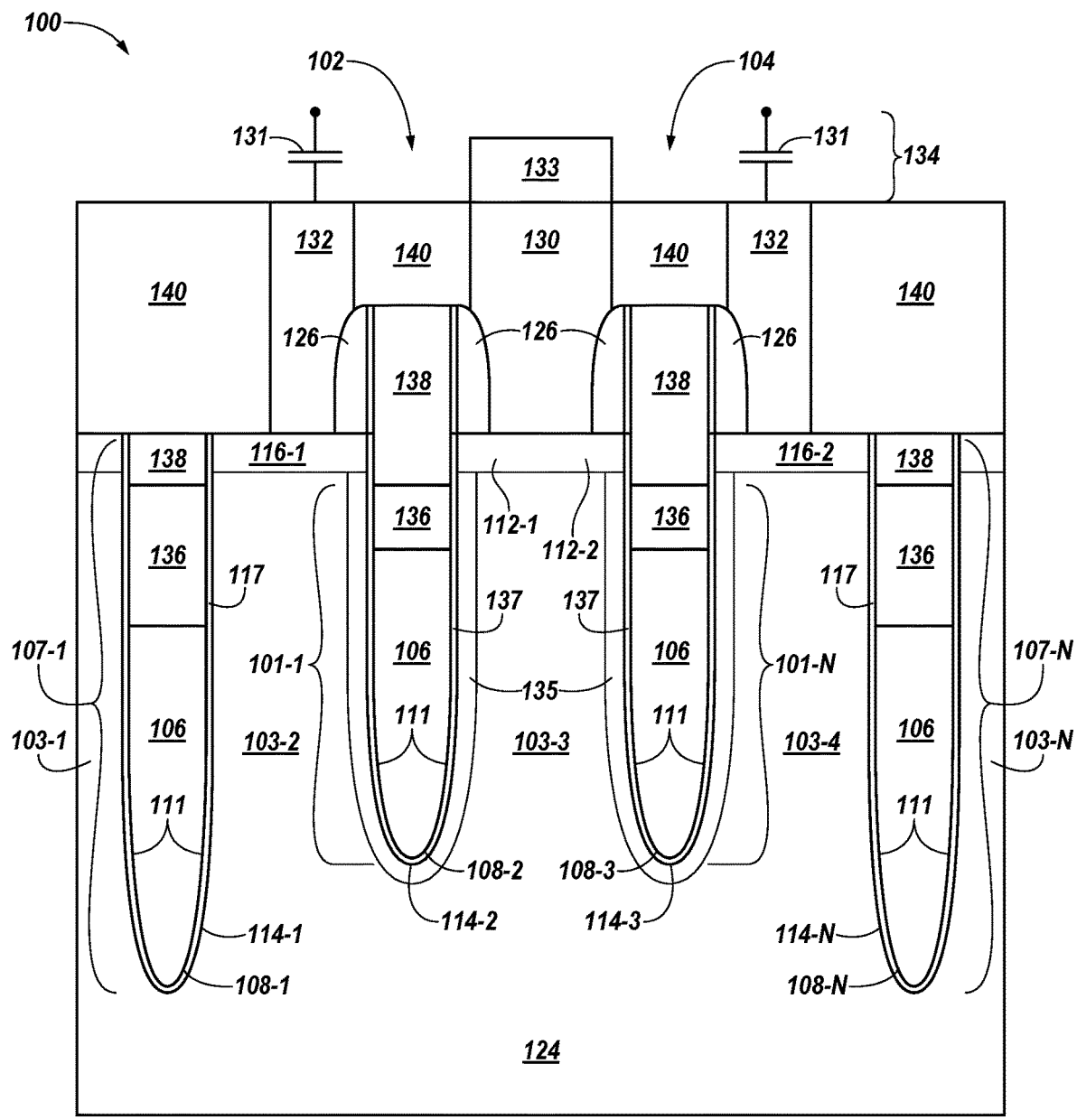
FIG. 1 illustrates an example cross-sectional view of a portion of a semiconductor structure formed in accordance with a number of embodiments of the present disclosure.

The physical size of memory devices is getting smaller. Memory devices may include memory cells including a transistor and a storage element. The transistor and storage element may be implemented as a one transistor one capacitor (1T1C) memory cell. The memory cells may be on pitch with other components of a memory devices such as sensing circuitry (e.g., sense amplifiers) and sub word line drivers (SWDs). As the pitch of these other components of the memory device decreases, the pitch of transistors of the memory device decreases as well. Decreasing the pitch of the transistors decreases the space between adjacent transistors, which may increase the probability of short channel effect (SCE) and/or random dopant fluctuation (RDF). A halo margin may be worsened and there may be a threshold voltage (Vt) mismatch between adjacent transistors. Increasing the space between adjacent transistors may reduce the probability of SCE but it also may limit the minimum pitch of other components of the memory device. Turning on and off transistors to shrinking devices and accurately detecting a stored charge during a read operation becomes more and more difficult.

In some approaches, a buried recessed access device (BRAD) may be used to accommodate shrinking size. A BRAD may use doping to improve channel conductivity. Scaling BRADs for future generations has become increasingly challenging due to coupled tradeoff between gate induced drain leakage (GIDL) and subthreshold leakage. Processes to achieve desired Vt through various implants, however, come with a tradeoff of higher GIDL due to higher junction electric field implant damage. Reduced scale for BRAD implementations also may result in a memory node coupled to an active access line (e.g., in an active area of a word line) for an access device (e.g., transistor) having an electric field at an interface that may cause GIDL of charge to an adjacent passing access line (e.g., in an isolation area of an adjacent word line). Charge leakage (e.g., transfer) to an adjacent isolation area, which is intended to reduce such charge leakage, may be counteracted by an increased frequency of data refresh operations being performed on storage nodes (e.g., capacitor cells). However, increasing the data refresh operation frequency as such may not be compatible with particular applications or design rules. In addition, such charge leakage may be accelerated by repeated access to the storage node by the access device within a brief period of time (e.g., by a row hammer effect) such that an intended charge of the storage node is not maintained, for example, by a predetermined data refresh operation frequency.

The present disclosure includes systems, apparatuses, and methods related to semiconductor structure formation. In contrast to some previous approaches, the present disclosure describes how charge transfer in a memory device may be reduced based on a number of embodiments of semiconductor structure formation. An example of an apparatus described herein includes a first trench and a second trench formed in a semiconductor substrate material, where the first and second trenches are adjacent and separated by the semiconductor substrate material and/or a pillar material. The apparatus includes a metallic material formed to a first height in the first trench that is less than, relative to a corresponding height in the semiconductor substrate material, a second height of the metallic material formed in the second trench and a polysilicon material formed over the metallic material in the first trench to a first depth greater than, relative to the corresponding height in the semiconductor substrate material, a second depth of the polysilicon material formed over the metallic material in the second trench. The greater first depth of the polysilicon material formed in the first trench reduces transfer of charge by way of the metallic material in the first trench.

Such an embodiment may, for example, include forming a trench (e.g., a portion of a trench) for a passing access line that is deeper than a trench (e.g., a portion of a trench) for an adjacent active access line and forming a metallic (conductive) material at a bottom of the trench for the passing access line such that it is deeper than metallic material at a bottom of the trench for the active access line. The trench for the passing access line may include a polysilicon material formed over (e.g., on) the metallic material such that the polysilicon material is also deeper than a polysilicon material formed over the metallic material for the active access line. The increased depth of the polysilicon material over the metallic material in the passing access line, relative to a depth of the polysilicon material over the metallic material in the active access line, may result in a bottom of the polysilicon material in the trench for the passing access line being lower than a top of the metallic material in the trench for the active access line. Such a difference may contribute to the reduced transfer of charge by way of the metallic material in the passing access line.

Hence, embodiments of semiconductor structure formation described herein may provide a number of benefits for data value retention in storage nodes of a memory device. Such benefits may, for example, include reducing a probability of a change in a data value stored by the storage node (e.g., from 0 to 1 or 1 to 0 depending on programming parameters), responsive to repeated access to the storage node, based on the reduced transfer of charge from the storage node. Alternatively or in addition, such benefits may include enabling a reduced frequency of data refresh operation performance for the storage node based on the reduced transfer of charge from the storage node, among other possible benefits based on critical dimensions (CDs), particular applications, and/or design rules, etc.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the figure number of the drawing and the remaining digits identify an element or component in the drawing. Similar elements or components between different figures may be identified by the use of similar digits. For example, 217 may reference element "17" in FIG. 1, and a similar element may be referenced as 317 in FIG. 3. In some instances, a plurality of similar, but functionally and/or structurally distinguishable, elements or components in the same figure or in different figures may be referenced sequentially with the same element number (e.g., 407-1 and 107-N in FIGS. 4A-4E).

Figure 9:
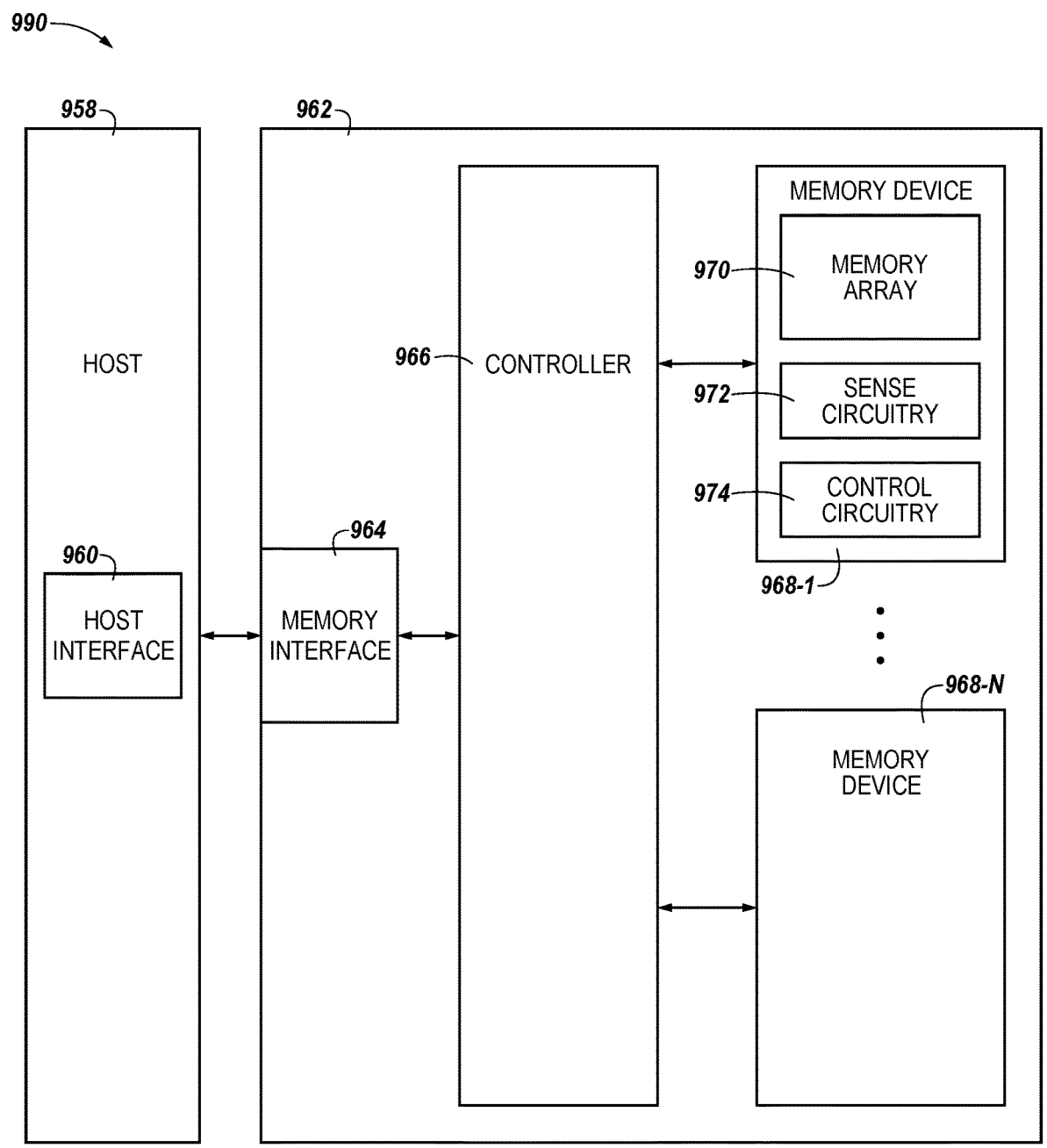
FIG. 9 is a functional block diagram of a computing system including at least one memory system in accordance with one or more embodiments of the present disclosure.

FIG. 1 illustrates an example cross-sectional view of a portion of a semiconductor structure 100 formed in accordance with a number of embodiments of the present disclosure. FIG. 1 illustrates neighboring access devices 102 and 104 (e.g., memory cell transistors), as may be present in a memory array of a memory device such as shown in FIG. 9.

In the example embodiment of FIG. 1, the neighboring access devices 102 and 104 are shown as BRADs. Embodiments, however, are not limited to this example. Isolation trenches 107-1, . . . 107-N (collectively or individually referred to as isolation trench 107) may be used to separate neighboring access devices from other access devices according to a particular array layout. FIG. 1 illustrates a pair of isolation trenches 107 in one such architecture in accordance with an embodiment of the present disclosure. In semiconductor structure 100, an isolation trench 107 may be included to reduce electric current and/or charge leakage from and between adjacent components of the semiconductor structure 100 (e.g., from a storage node 131 coupled to access devices 102 and 104). Isolation trenches 107 may be formed by etching a pattern of the isolation trenches 107 between pillars 103-1, . . . 103-N and/or into semiconductor substrate material 124 and depositing dielectric materials (e.g., an oxide 117) into the isolation trench 107.

In a semiconductor fabrication process, trenches may be formed and a gate dielectric 137 and semiconductor materials may be deposited to form gates 106 and 136 (collectively or individually referred to as gate 106) in trenches 101-1 and 101-N for an access device (e.g., BRAD devices 102 and 104 according to a particular BRAD design process) coupled to a storage node 131. A gate 106 in isolation trenches 107-1 and 107-N may be referred to as a passing access line that is not directly coupled to a neighboring (e.g., adjacent) access device or storage node. Embodiments are not limited to the example shown.

In this example of neighboring BRAD devices 102 and 104, isolation trench 107 may be formed to a greater depth than a depth of a gate 106 used to form an active area of the access line (e.g., at 106 and 136) in the trenches 101-1, . . . 101-N of the BRAD devices 102 and 104. The isolation trench 107 may, in a number of embodiments, be formed to have an isolation area with a depth of 150 nanometers (nm) or greater, a width of 15 nm or less, and an aspect ratio (AR) of depth to width of ten to one (10:1) or greater. In contrast, a trench 101 for the access devices 102 and 104 may be formed to have an active area (e.g., including a hybrid metal gate formed from 106 and 136) with a depth of less than 150 nm, a width of 15 nm or less, and an aspect ratio of less than 10:1. Accordingly, a bottom 108-1 and 108-N of the respective isolation trenches 107-1 and 107-N may be at a greater depth relative to a bottom 108-2 and 108-3 of the respective trenches 101-1, . . . 101-N for the BRAD devices 102 and 104. In a number of embodiments, consistent with the depths presented above, the greater depth of the isolation trenches 107 may be in a range of from around 20 nm to around 50 nm.

In a number of embodiments, a dielectric material 117 may be deposited into the isolation trenches 107-1 and 107-N. The dielectric material 117 may be deposited to a thickness in a range of 1-5 nm on inside walls 114-1 and 114-N of the respective isolation trenches 107-1 and 107-N to form sidewalls 111 of an opening (e.g., as shown at 410 and described in connection with FIGS. 4A-4E). The dielectric material 117 may be an initial barrier between the pillars 103 and/or the semiconductor substrate material 124 and the other neighboring semiconductor devices and/or components. In a number of embodiments, the dielectric material 117 may be an oxide deposited using a conformal deposition technique, such as a chemical vapor deposition (CVD) technique in a semiconductor processing apparatus (e.g., as shown and described in connection with FIG. 8). The oxide used for the dielectric material 117 may be a silicon oxide (SiOx), which not by way of limitation may be representative of $SiO_2$.

As shown in FIG. 1, gates 106 are also formed for the access devices 102 and 104. As shown, the gate 106 may be a gate to a BRAD. As described further (e.g., in connection with FIGS. 4A-4E and elsewhere herein), the gate 106 may be formed from a metallic material (e.g., tungsten (W), titanium nitride (TiN), among other possible metals, metallic compounds, and combinations thereof that may collectively be called metallic materials 106), and a polysilicon material 136 formed over (e.g., on) the metallic material 106 to create a hybrid metal gate (HMG). In a number of embodiments, the polysilicon material 136 may be, or may include, a doped polysilicon. The doped polysilicon used for the gates 106 in the isolation areas of trenches 107-1 and 107-N and the active areas of trenches 101-1, . . . 101-N may be an n-doped polycrystalline silicon. The polysilicon material 136 over the metallic material 106 in the isolation area of the passing access line in trench 107 may extend deeper into the semiconductor substrate material 124 than polysilicon material 136 formed over the metallic material 106 in the active area of trench 101. A top of the metallic material 106 in the isolation area of the passing access line in isolation trench 107 also may be deeper in the semiconductor substrate material 124 than a top of the metallic material 106 in the active area of trench 101. Hence, a passing access line in isolation trench 107 may be deeper in a range of from around 20 nm to around 50 nm than an active access line in trench 101 (e.g., conforming to the increased depth of the bottom 108 of trench 107 relative to the bottom of trench 101).

In the example of FIG. 1, in the active areas of trenches 101-1, . . . 101-N, the gate 106 may be separated from a channel 135, separating a first source/drain region 116-1 and 116-2 (collectively or individually referred to as first source/drain region 116) and a second source/drain region 112-1 and 112-2 (collectively or individually referred to as second source/drain region 112) by a gate dielectric 137. Two neighboring access devices 102 and 104 are shown sharing a second source/drain region 112 at a junction. A sense line contact 130 may be formed of a metallic material, or other conductive contact. The sense line contact 130 may be formed in contact with the second source/drain region 112, and the junction. A sense line 133 (e.g., digit line or bit line) may be formed in contact with the sense line contact 130. A storage node contact 132 may be coupled to each first source/drain region 116 and a storage node 131 may be coupled to the storage node contact 132. An insulation material 140 (e.g., a dielectric material) may be formed on spacer material 126 and mask material 138 to separate conductive contacts 132.

In a number of embodiments, a portion of the sense line contact 130 may be formed in contact with spacer material 126, the second source/drain regions 112, and the junction. Insulation material 140 may be formed on the spacer material 126, the mask material 138, and in contact with a portion of the sense line contact 130 and storage node contacts 132. A gate dielectric 137 may separate the gate 106 from the channel 135 for each of the neighboring BRAD devices 102 and 104 shown in the example of FIG. 1.

Figure 2:
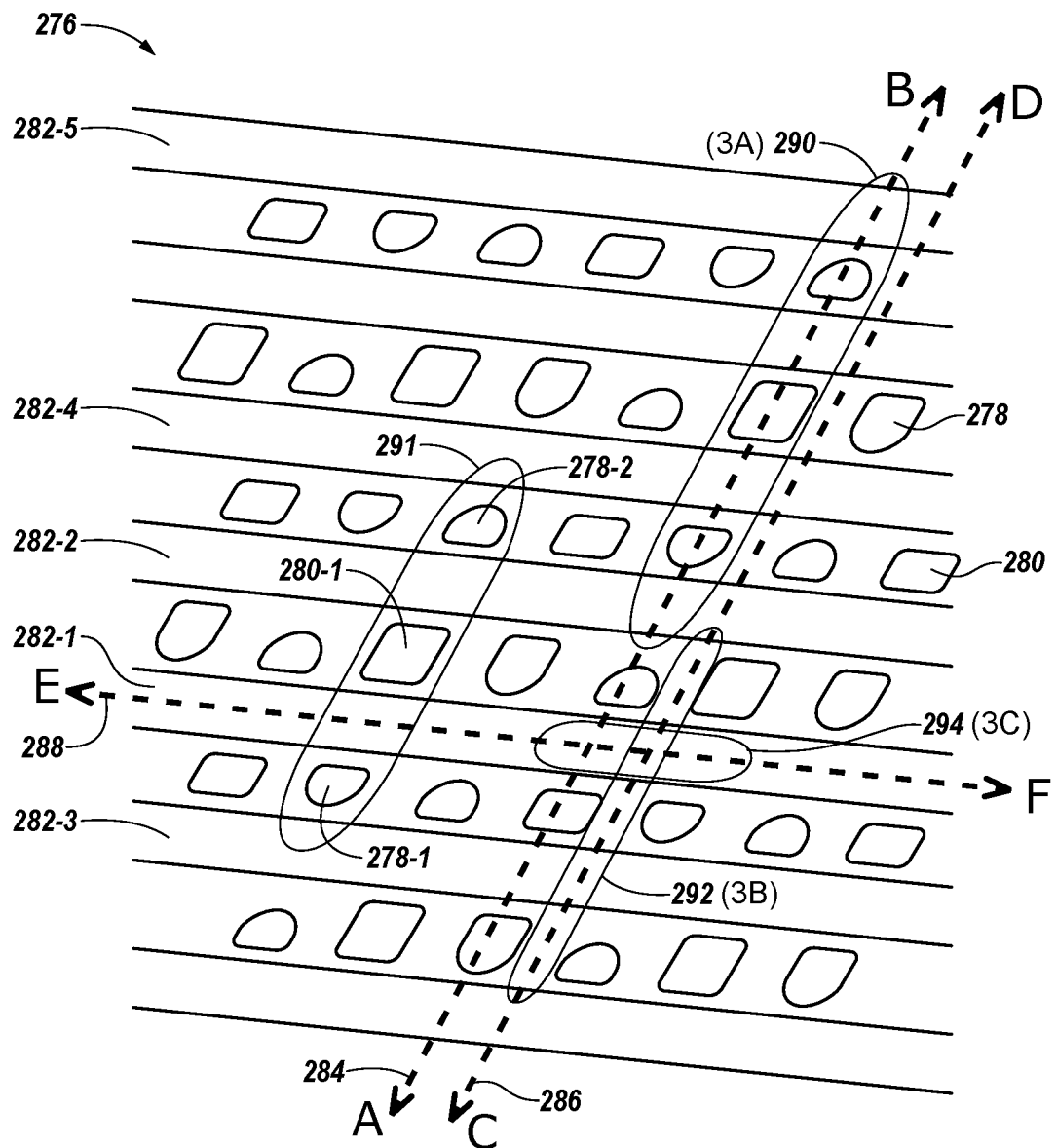
FIG. 2 illustrates an example top-down view of a memory array structure in accordance with a number of embodiments of the present disclosure.

FIG. 2 illustrates an example top-down view of a memory array structure 276 in accordance with a number of embodiments of the present disclosure. FIG. 2 illustrates a number of active area regions (e.g., 290 and 291), first source/drain regions 278, and second source/drain regions 280. Area 291 encompasses a pair of access devices sharing a second source/drain region 280-1 that may be connected to a sense line and a pair of first source/drain regions 278-1 and 278-2. The second source/drain region 280-1 and the first source/drain region 278-1 may be separated by a channel and an access line 282-1. Adjacent the example active areas 291 and 290 on either side may be located a number of passing access lines 282-3 and 282-4 to other active areas.

Figure 3A:
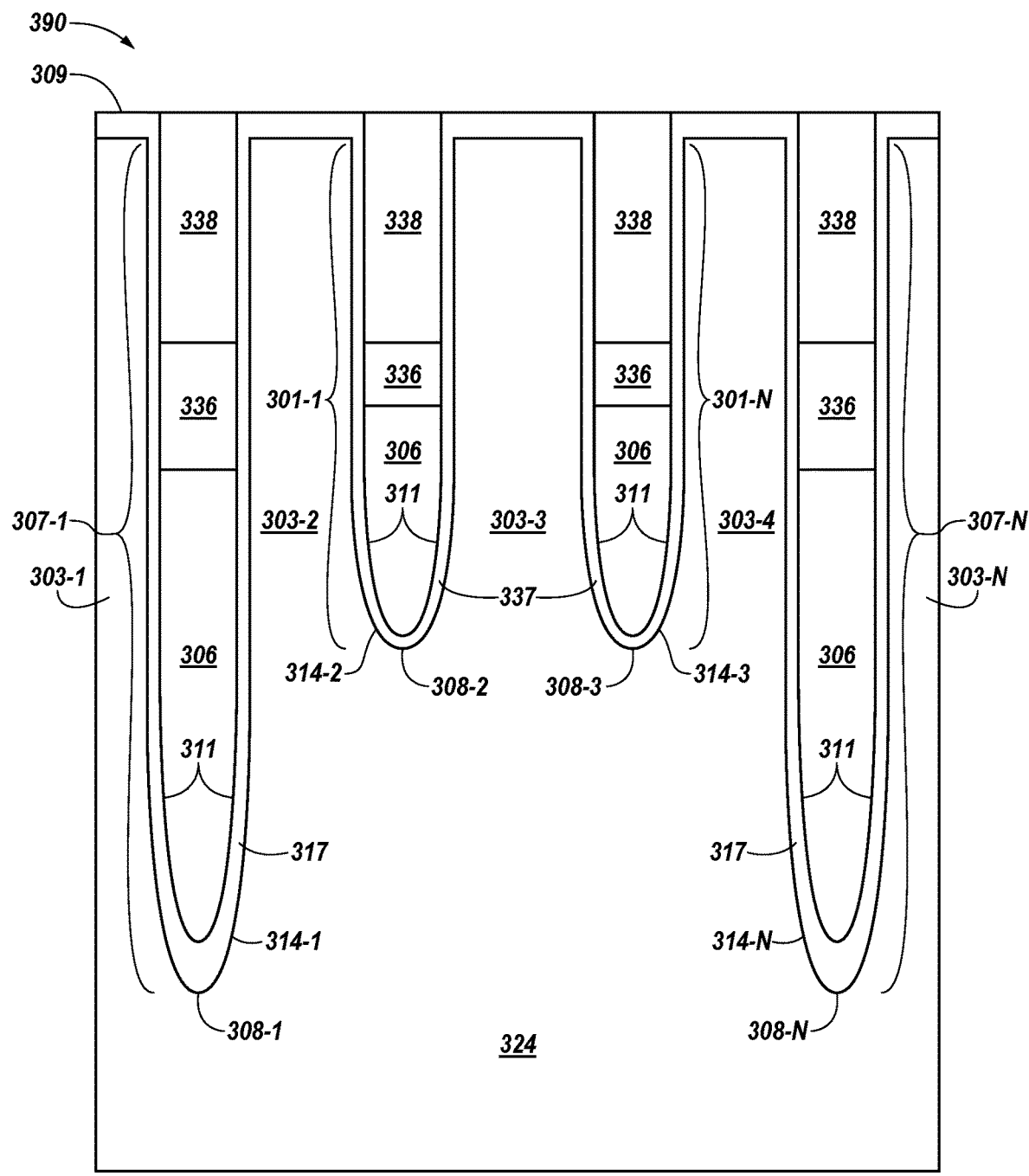
FIGS. 3A-3C illustrate example cross-sectional views of a memory array structure at different locations within a semiconductor substrate in a semiconductor fabrication sequence in accordance with a number of embodiments.

In the example of FIG. 2, area 290 encompasses an active area of neighboring access devices and neighboring, passing access lines 282-2 and 282-5. A cross-sectional view taken along cut line A-B 284 is shown in FIG. 3A. The passing access lines 282-2 and 282-5 in area 290, may be formed in isolation trenches (e.g., isolation trenches 107 in FIG. 1). Area 291 illustrates a pair of access devices sharing a source/drain region. Semiconductor structures formed according to the top-down view of an example memory array layout may include access devices (e.g., transistors) and storage nodes (e.g., capacitor cells), etc. A dynamic random access memory (DRAM) array is one form of example memory array that may be formed from semiconductor structures fabricated through a semiconductor fabrication process performed on a substrate of a semiconductor wafer. A memory array may have an of array of access devices and storage nodes forming memory cells at the intersection of rows and columns.

Figure 3B:
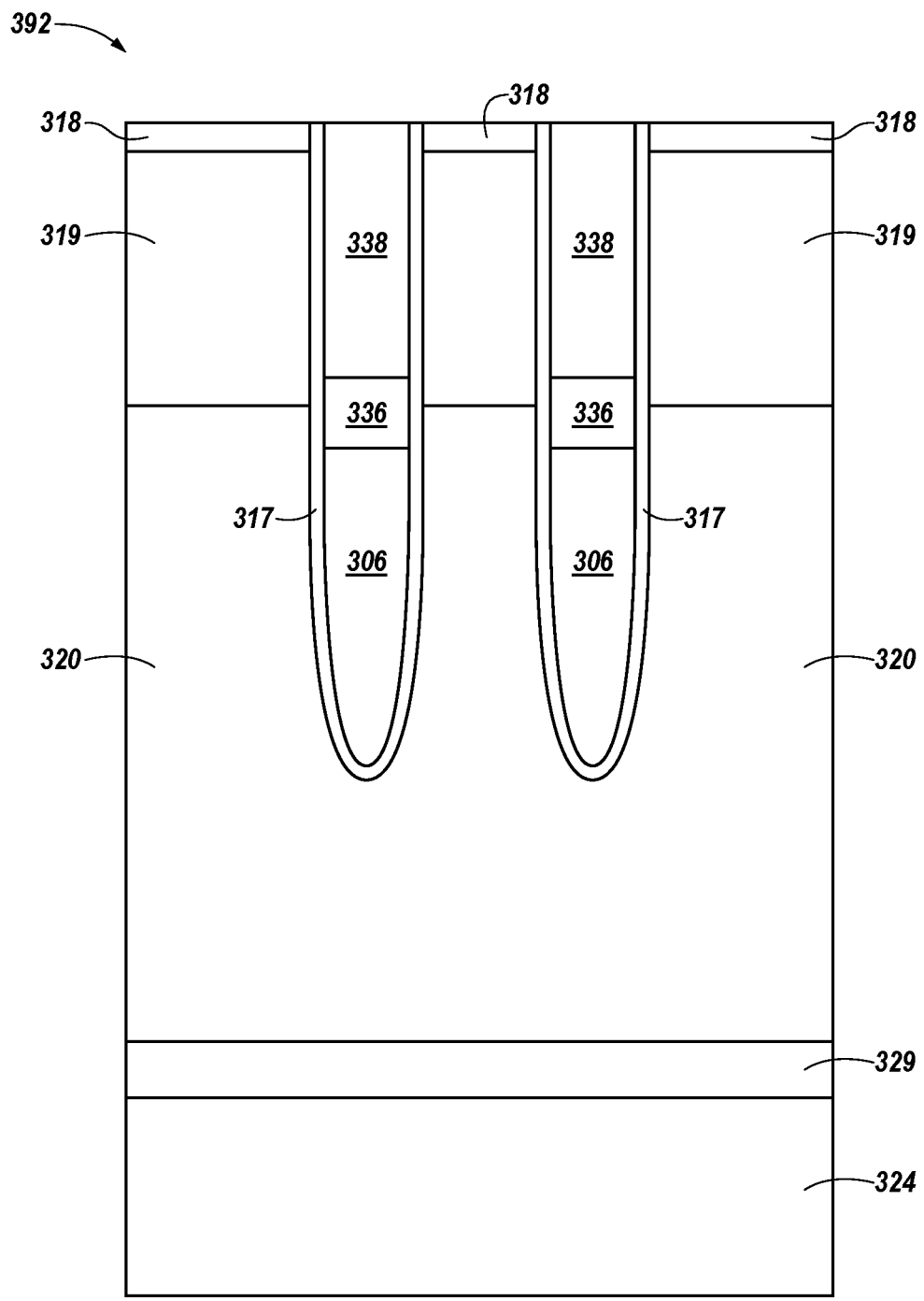

Area 292 illustrates an isolation area between columns of sense lines to access devices taken along cut line C-D 286. A cross section along cut-line C-D 286 is shown in FIG. 3B. The isolation area may be formed by depositing a dielectric material between adjacent active area regions (e.g., 291 and 290). The dielectric material in the isolation area may decrease the likelihood of semiconductor structures formed adjacent the active area region 291 and 290 communicating (e.g. disturbing one another) in a manner that is not intended. Area 292 may also encompass portions of passing access lines 282-2.

Figure 3C:
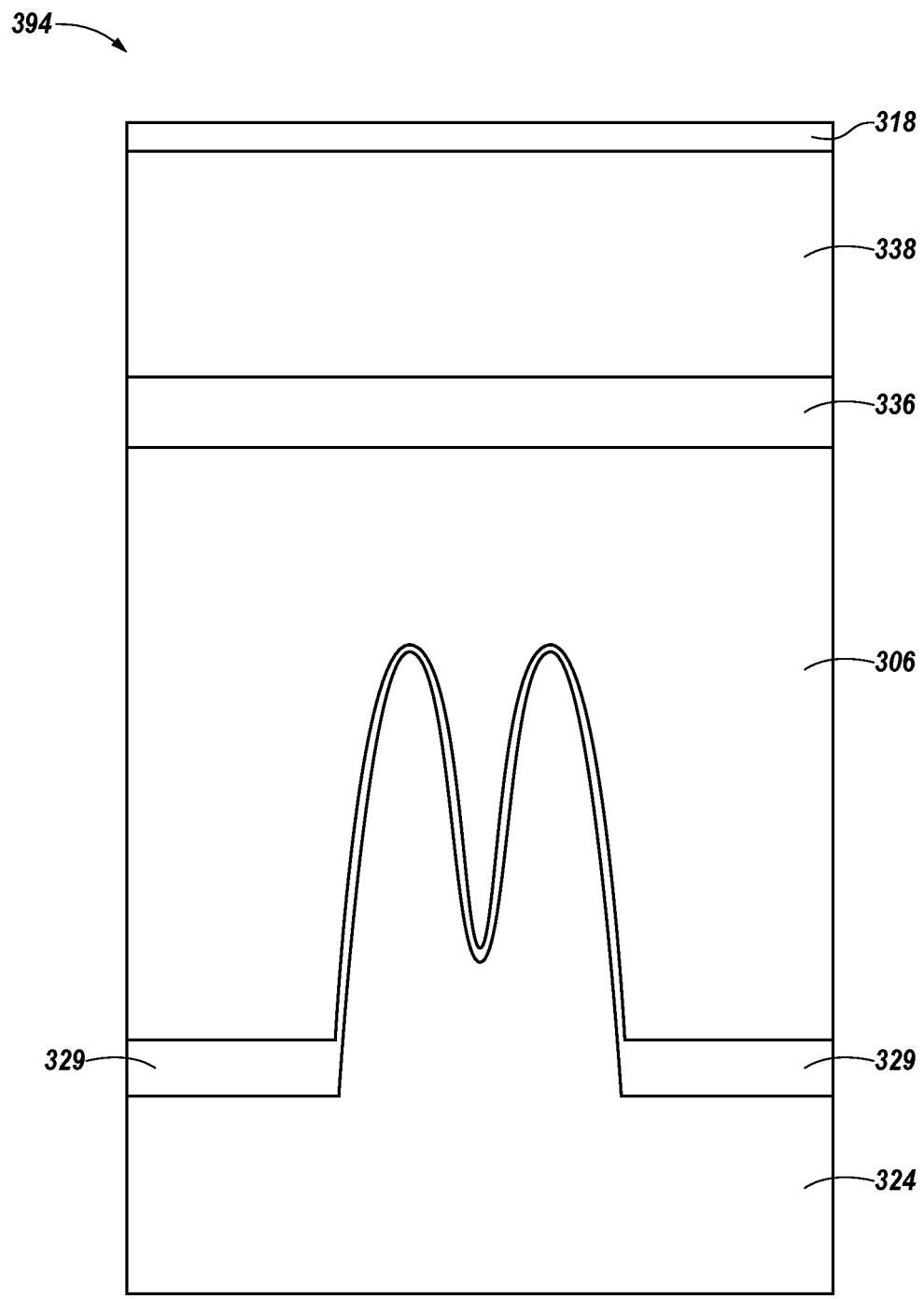

Area 294 illustrates a portion of an access line 282-1 along cut-line E-F 288. A cross section along cut-line E-F 288 is shown in FIG. 3C. The access line 282-1 may serve as a gate to adjacent to active areas. An access line (e.g., word line) may be used to activate an access device (e.g., access transistor) to access (e.g., turn "on" or "off" access) to the storage node (e.g., capacitor cell) of a memory cell. A sense line (e.g., bit line) may be used to read and/or program (e.g., write, refresh, erase, etc.) to and/or from a storage node of the memory cells.

FIGS. 3A-3C illustrate example cross-sectional views of a memory array structure at different locations within a semiconductor substrate in a semiconductor fabrication sequence in accordance with a number of embodiments. The cross-sectional views of FIGS. 3A-3C correspond to cut lines A-B, C-D, and E-F shown in FIG. 2.

FIG. 3A illustrates a cross-sectional view of the memory array structure taken along cut-line A-B and encompassed by active area region 290 as shown in FIG. 2 at particular point in time in a semiconductor structure fabrication process. FIG. 3A illustrates isolation trenches 307-1 and 307-N (collectively or individually referred to as isolation trench 307) and gates 336 and 306 (collectively or individually referred to as gate 306) formed to a depth, at a bottom of 308-1 and 308-N of the trenches, into a working surface 309 of a semiconductor structure on a semiconductor substrate material 324. FIG. 3A also illustrates a gate dielectric 337 deposited on the gate 306 in trenches 301-1 and 301-N for the access devices. The trenches 301 and gates 336 and 306 for the active area may be formed to a depth, at a bottom of 308-2 and 308-3 of the trenches, that is less than the depth of the bottoms 308-1 and 308-N of the isolation areas of trenches 307-1 and 307-N. The trenches 301 and 307 may be formed between pillars 303-1, . . . 303-N that in a three-dimensional representation (e.g., as shown and described in connection with FIGS. 4A-4E) may be presented as walls that define the boundaries of the trenches.

An isolation area of trenches 307-1 and 307-N may include dielectric material 317 on a respective wall 314-1 and 314-N of the trench along with passing access line conductive materials 306 and 336 and an insulator fill material 338 within a wall of an opening 311 in the dielectric material 317. An active area of trenches 301-1 and 301-N may include gate dielectric material 337 on a respective wall 314-2 and 314-3 of the trench along with active access line conductive materials 306 and 336 and insulator fill material 338 within a wall of an opening 311 in the gate dielectric material 337. In various embodiments, the dielectric material 317 for the isolation area of trench 307 and the gate dielectric material 337 for the active area of trench 301 may both be SiOx; however, embodiments are not so limited.

FIG. 3B illustrates a cross-sectional view of the memory array structure taken along cut-line C-D and encompassed by active area region 392, as shown in FIG. 2, at a particular point in time in a semiconductor structure fabrication process. FIG. 3B illustrates isolation trenches 307. An isolation trench 307 may include dielectric material 317, passing access line conductive material 306 and 336, and an insulator fill material 338. FIG. 3B may also include a semiconductor substrate material 324 and additional dielectric materials 318, 319, 320 and 329.

FIG. 3C illustrates a cross-sectional view of the memory array structure, taken along cut-line E-F, and encompassed by active area 394, as shown in FIG. 2, at a particular point in time in a semiconductor structure fabrication process. FIG. 3C illustrates semiconductor substrate material 324, dielectric material 329, passing access line conductive material 306 and 336, and a mask material 338.

FIGS. 4A-4E illustrate perspective views of various cutaways of a portion of an example three-dimensional semiconductor structure at particular points in an example semiconductor fabrication sequence in accordance with a number of embodiments of the present disclosure. The fabrication sequence illustrated in FIGS. 4A-4E is shown at particular points in time that correspond to particular processing activities being performed in the fabrication process. Other processing activities included in a particular fabrication process may be omitted for ease of illustration.

Figure 4A:
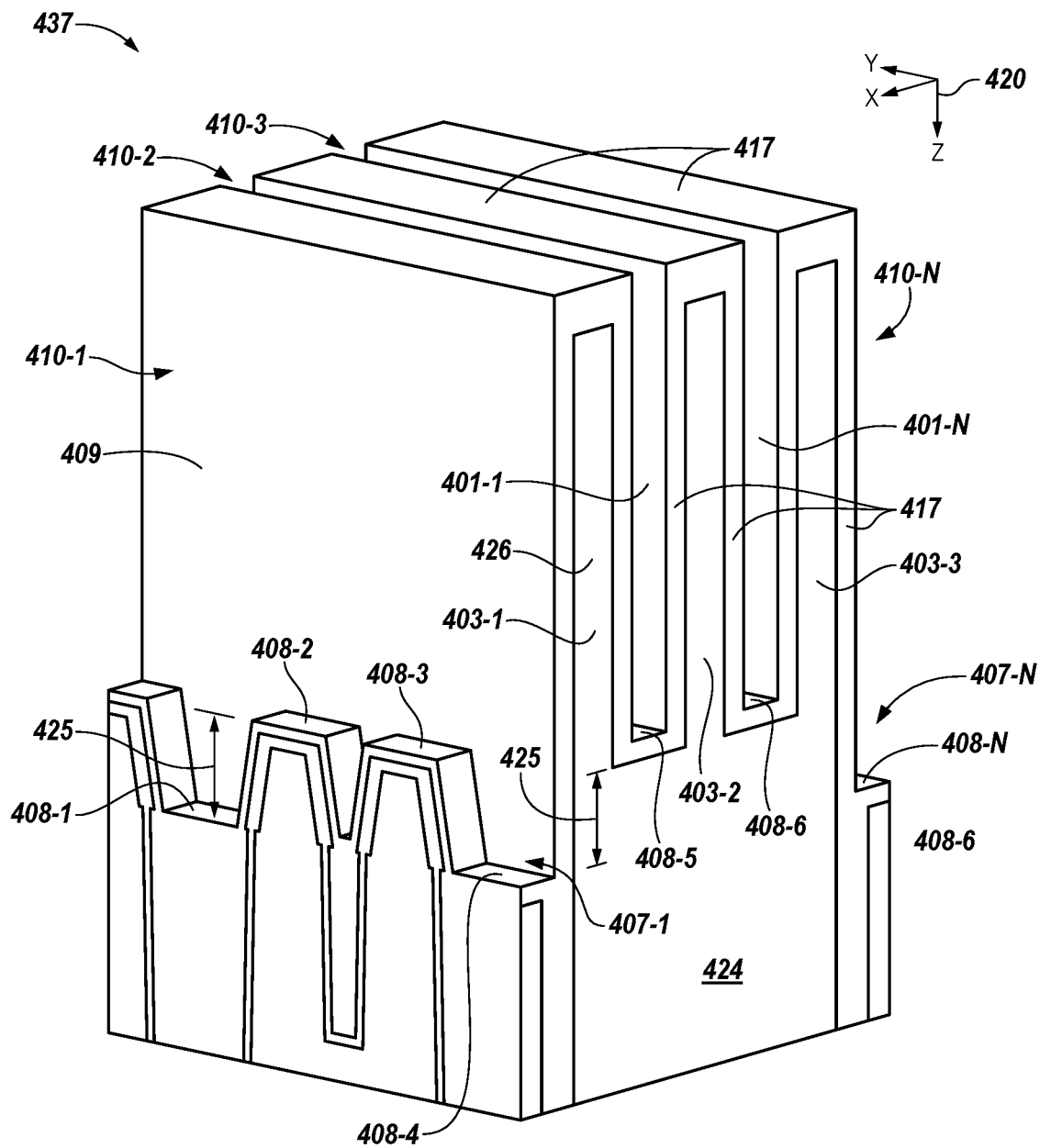
FIGS. 4A-4E illustrate perspective views of various cutaways of a portion of an example three-dimensional semiconductor structure at particular points in an example semiconductor fabrication sequence in accordance with a number of embodiments of the present disclosure.

FIG. 4A illustrates a perspective view of example structural features 437 of a portion of an example semiconductor structure at a particular point in time in the example fabrication sequence. The semiconductor structures described herein may include the example memory devices shown at 100 and 968 and described in connection with FIGS. 1 and 9, respectively, although embodiments are not intended to be limited to these types of memory devices.

The structural features 437 illustrated in FIG. 4A are shown at a point in time that corresponds to processing activities already having been performed in the fabrication sequence. The portion of the structural features 437 illustrated in FIG. 4A show a structural configuration at a comparative baseline for structure formation as described herein. The structural features illustrated in FIGS. 4A-4E are shown at points in time after various other processing activities have been performed along the fabrication sequence. Other structural features and processing activities may have been omitted from FIGS. 4A-4E for simplicity.

The illustrated structural features and processing activities may correspond to formation and removal of structural features. For example, in a number of embodiments, the structural features may be formed using deposition processes such as diffusion, spin-on deposition, atomic layer deposition, physical vapor deposition, chemical vapor deposition, plasma-enhanced chemical vapor deposition, pulsed laser deposition, sputter deposition, and seam suppressed bottom-to-top deposition (as further described elsewhere herein), among other suitable deposition processes. Alternatively or in addition, the structural features may be formed using atomic layer epitaxy. Subtractive etch process (e.g., any suitable wet etch or dry etch process) may be used to remove specific portions of the various materials such that the remaining materials contribute to formation of the intended components. Alternatively or in addition, additive (e.g., damascene) deposition processes may be used to form the structural features. A number of embodiments may, for example, use chemical mechanical planarization (CMP) instead of a subtractive etch process.

An example system 880 that may be used for such processing activities is shown and described in connection with FIG. 8. The various processing activities may, in a number of embodiments, be performed using the single system 880 illustrated in FIG. 8 or may be performed using a plurality of such systems that are each capable of performing particular activities in the fabrication sequence. For example, portions of the fabrication sequence that use a wet etch process may be performed in one part of the processing system and other portions of the fabrication sequence that use a dry etch process conducted in a vacuum may be performed in another part of the processing system.

FIG. 4A includes an orientation indicator 420 having axes x, y, and z. The direction indicated by axis x is intended to orient descriptions of a component associated with a trench being "adjacent" or "neighboring" another component in another trench (e.g., separated by a pillar). The direction indicated by axis x also may be applied to orient a description of an opening or trench being "between" two pillars (although each opening or trench may extend in a direction indicated by the y axis). The direction indicated by axis y is intended to orient descriptions of a component in a trench being "adjacent" or "neighboring" another component in the same trench (e.g., not separated by a pillar). For example, such components may be an isolation area and an active area in two adjacent trenches in the orientation indicated by the x axis or in the same trench in the orientation indicated by the y axis. The direction indicated by axis y also may be applied to a description of, for example, resistance "along a length of" first and second portions of a trench. The direction indicated by axis z is intended to orient descriptions of a top or a bottom of a component and/or descriptions of a component or material (e.g., layer) being formed on top of or below another component or material.

Formation of the structural features 437 illustrated in FIG. 4A may, for example, include formation (e.g., deposition or etching) of pillars 403-1, . . . 403-N (which may correspond to pillars 103-1, 103-N shown and described in connection with FIG. 1) on or into the semiconductor substrate 424 during formation of the semiconductor structure. In a number of embodiments, at least one of silicon (Si), poly-Si, amorphous Si, and doped Si may be used as pillar material 426 for formation of the pillars 403 and at least one of Si, poly-Si, and amorphous Si may be used for formation of the semiconductor substrate material 424.

An oxide material 417 may be formed (e.g., deposited) on the pillar material 426 from over (e.g., on) a top of the pillar material 426 and over (e.g., on) inside walls of isolation trenches 407-1 and 407-N to form sidewalls of openings 410-1 and 410-N. The oxide material 417 also may be formed on the pillar material 426 from over (e.g., on) a top of the pillar material 426 and over (e.g., on) inside walls of trenches 401-1 and 401-N for access devices to form sidewalls of openings 410-2 and 410-3. The oxide material 417 for trenches 401-1 and 401-N may, in a number of embodiments, correspond to the gate oxide material 137 shown and described in connection with FIG. 1. The oxide material 417 and/or the gate oxide material 137, in a number of embodiments, may be, or may include, a SiOx dielectric (e.g., $SiO_2$) formed to a thickness in a range of 1-5 nm. The inside walls of the trenches 401 and 407 and the sidewalls of the openings 410 are shown at 114 and 111 and are described in connection with FIG. 1.

As described herein, a first trench (e.g., as shown at 407-1 and 407-N and collectively or individually referred to as trench 407) and a second trench (e.g., as shown at 401-1 and 401-N and collectively or individually referred to as trench 401) may be formed in the semiconductor substrate material 424. The first trench 407 and the second trench 401 are adjacent and are separated by the semiconductor substrate material 424 and/or the pillar material 426. The first trench 407 may have a first bottom (e.g., a portion of the first trench 407 shown at 408-1, 408-4, and 408-N) at a greater depth 425 relative to a second bottom (e.g., a portion of the second trench 401 shown at 408-2, 408-3, 408-5, and 408-6) of the second trench 401. The greater depth 425 of the bottom of the first trench 407 relative to the bottom of the second trench 401 may, in a number of embodiments, be in a range of from around 20 nm to around 50 nm.

Figure 4B:
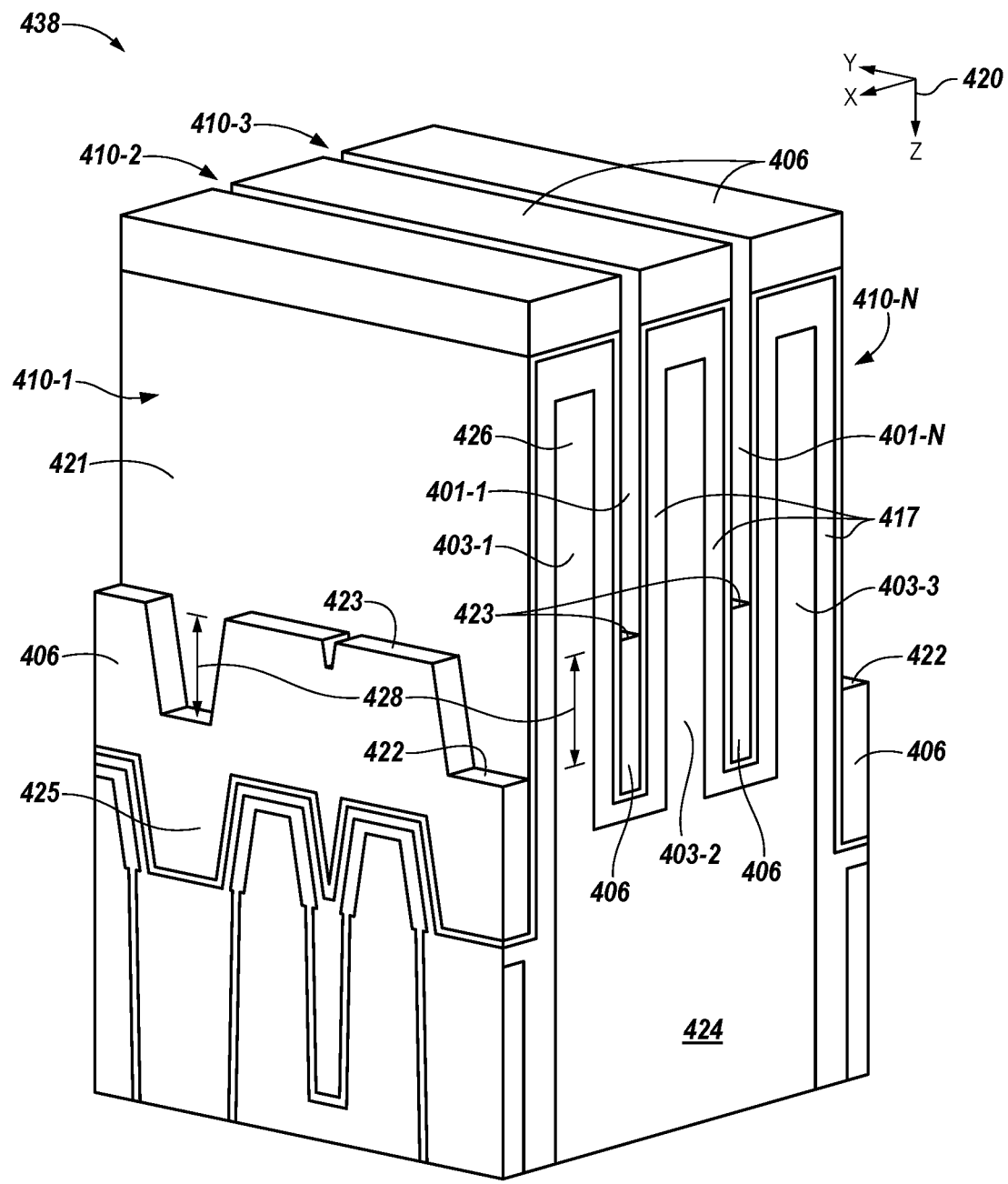

FIG. 4B illustrates a perspective view of example structural features 438 at a particular point in time after that shown in FIG. 4A in the example fabrication sequence in accordance with a number of embodiments of the present disclosure. FIG. 4B shows that a metallic material 406, in a number of embodiments, may be formed over (e.g., on) the oxide material 417 to a first height 422 in the first trench 407 that is less than 428, relative to a corresponding height in the semiconductor substrate material 424, a second height 423 of the metallic material 406 formed in the second trench 401. For ease of illustration, and because each trench described herein may have isolation areas corresponding to the first depths shown at 408-1, 408-4, and 408-N and active areas corresponding to lesser depths shown at 408-2, 408-3, 408-5, and 408-6, the difference 428 in the first height 422 of the metallic material 406 relative to the second height 423 of the metallic material 406 is also illustrated in trench 407-1.

The metallic material 406, in a number of embodiments, may be, or may include, W and/or TiN. For example, the metallic material 406 may be formed from either one of W and TiN, or the metallic material 406 may be formed from a mixture of W and TiN, from alternating layers of W and TiN, or from one or both of W and TiN in addition to one or more other metallic materials.

As described further elsewhere herein, the metallic material 406 may be deposited using a deposition technique that reduces a probability of (e.g., suppresses) seam formation in the metallic material 406 during deposition in a trench having a narrow width relative to depth resulting in a high AR (e.g., an AR of at least 5:1). Among other features of the deposition technique, the technique is designed to reduce a rate of deposition of the metallic material 406 on top of the pillars 403 and on an upper portion of the sidewalls of the openings 410-1 and 401-2 of the respective first and second trenches 407-1 and 401-1 relative to a rate of deposition of the metallic material 406 on a lower portion of the sidewalls and bottoms of the first and second trenches in order to enable a controlled bottom-to-top deposition that suppresses seam and/or void formation in the metallic material 406 during deposition.

The metallic material 406 may be formed so that the metallic material 406 has a substantially equal height above the bottom 408 of each of the first and second trenches 401-1 and 401-1. In a number of embodiments, the metallic material 406 may be deposited substantially simultaneously in the first and second trenches to reach the substantially equal height. As such, the first height 422 of the metallic material in the first trench 407 may be less than the second height 423 of the metallic material 406 formed in the second trench 401. The difference 428 in the first and second heights 422 and 423 may, in a number of embodiments, conform to the difference 425 in the depth of the bottom of the first trench 407 relative to the bottom of the second trench 401. The difference 428 in the first and second heights 422 and 423 conforming to the difference 425 in the depth of the bottoms of the trenches may, in a number of embodiments, result from using the bottom-to-top deposition technique described herein to differentially deposit different depths of the metallic material 406 in different portions of a trench and/or from using a timed etch technique in the different portions of the trench. Accordingly, the difference 428 may be in a range of from around 20 nm to around 50 nm.

In a number of embodiments, a spacer material 421 may be formed over (e.g., on) the oxide material 417 prior to the metallic material 406 being formed over (e.g., on) the spacer material 421. The spacer material 421 may be formed from TiN, although embodiments are not so limited. The spacer material 421 may be formed on the oxide material 417 as a layer having a thickness in a range of from around 1 nm to around 3 nm.

Figure 4C:
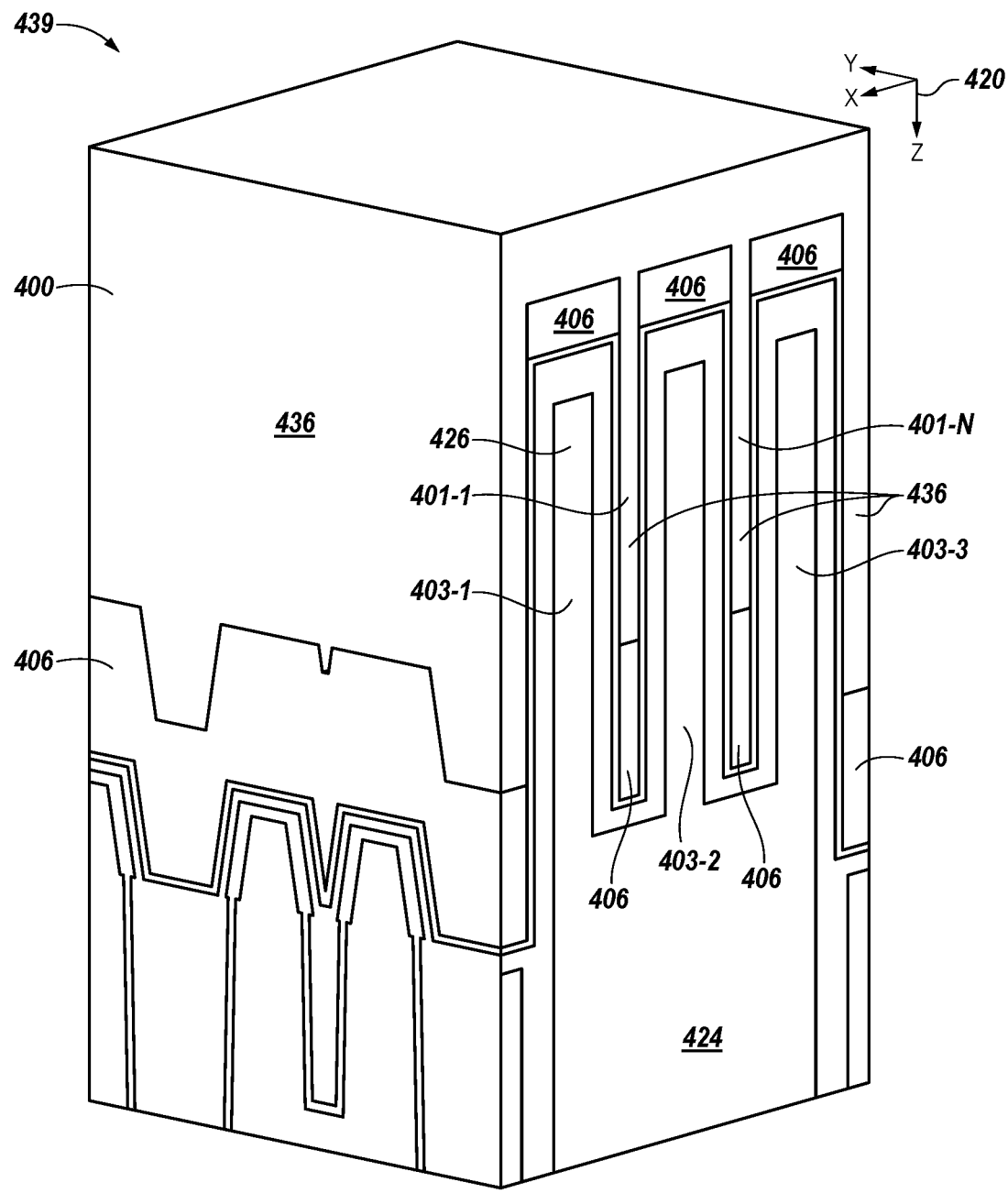

FIG. 4C illustrates a perspective view of example structural features 439 at a particular point in time after that shown in FIG. 4B in the example fabrication sequence in accordance with a number of embodiments of the present disclosure. FIG. 4C shows that polysilicon material 436 has been formed over (e.g., deposited on) the semiconductor structure 400. The polysilicon material 436 may be deposited to fill the openings 410-1 and 410-N of the respective trenches 407-1 and 407-N and to fill the openings 410-2 and 410-3 of the respective trenches 401-1 and 401-N to cover the metallic material in each of the trenches. Deposition of polysilicon material 436 also may result in formation of (e.g., a layer of) the polysilicon material 436 above the trenches 407 and 401 and above the pillars 403 and/or the metallic material 406 deposited on top of the pillars. The polysilicon material 436, in a number of embodiments, may be, or may include, an n-doped polycrystalline silicon.

Figure 4D:
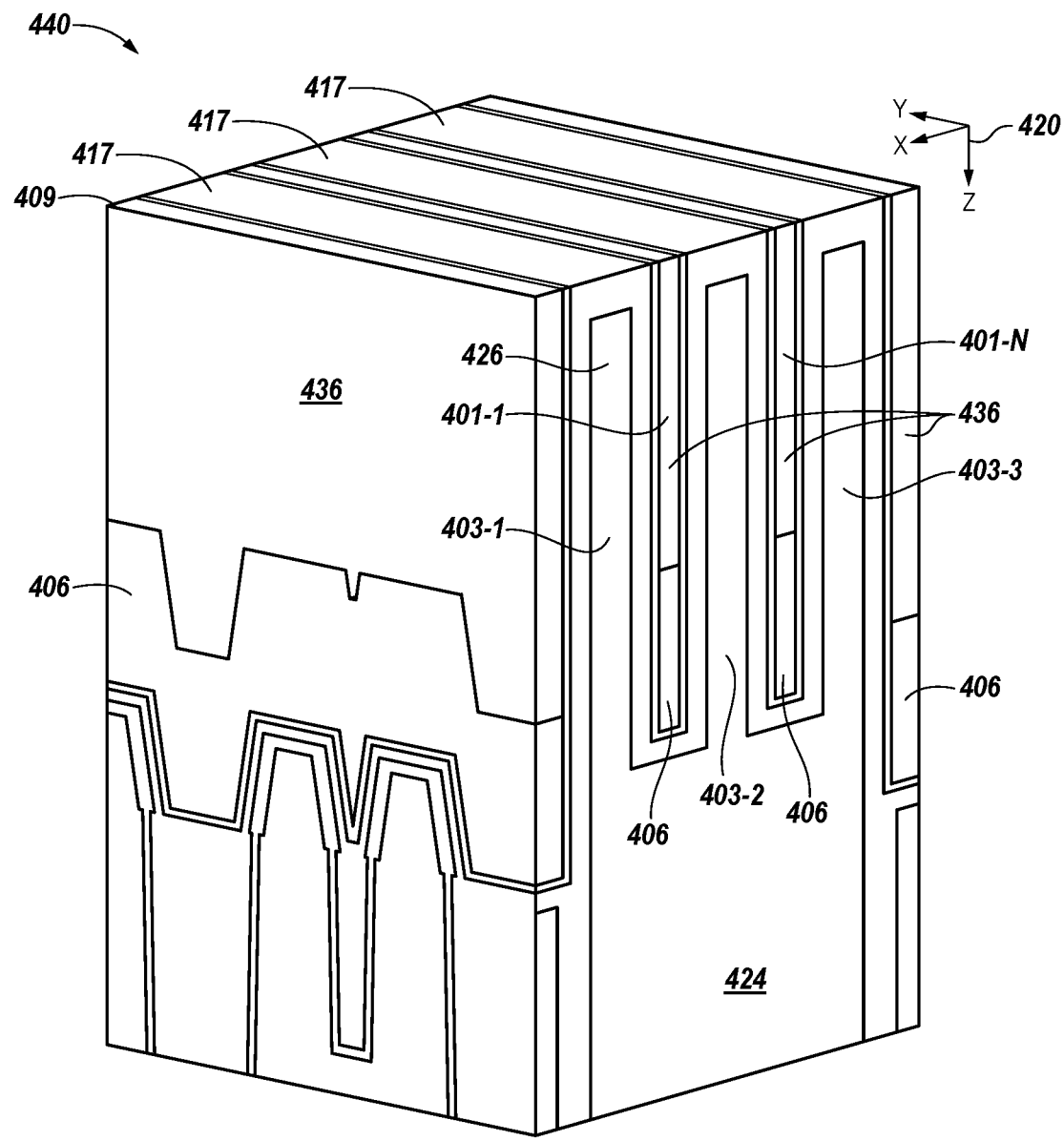

FIG. 4D illustrates a perspective view of example structural features 440 at a particular point in time after that shown in FIG. 4C in the example fabrication sequence in accordance with a number of embodiments of the present disclosure. FIG. 4D shows that the polysilicon material 436 formed above the trenches 407 and 401 and the polysilicon material 436 and metallic material 406 formed above the oxide material 417 on top of the pillars 403 may be removed to expose the working surface 409 of the semiconductor structure 400. The polysilicon material 436 and metallic material 406 may, in a number of embodiments, be removed by performance of CMP and/or a number of appropriate etch techniques.

Figure 4E:
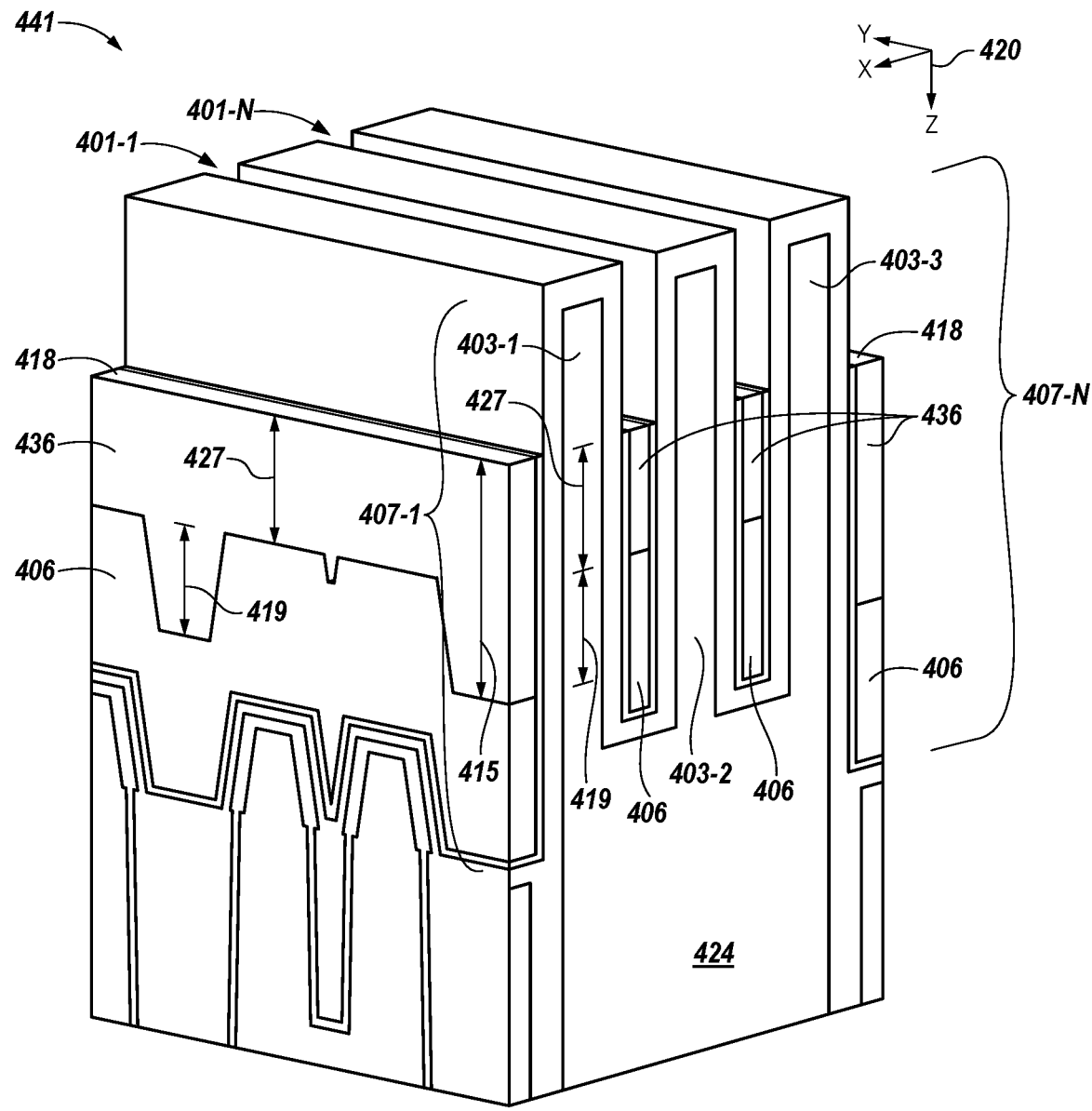

FIG. 4E illustrates a perspective view of example structural features 441 at a particular point in time after that shown in FIG. 4D in the example fabrication sequence in accordance with a number of embodiments of the present disclosure. FIG. 4E shows that a portion of the remaining polysilicon material 436 has been removed to a substantially equal depth 418 in the trenches 407 and 401. In a number of embodiments, the polysilicon material 436 may be etched substantially simultaneously (e.g., using a dry etch technique) in the trenches 407 and 401 to reach the substantially equal depth 418. As such, a first height 418 of the polysilicon material 436 in a first trench 407-1 may be substantially equal, relative to a corresponding height in the semiconductor substrate material 424, to a second height 418 of the polysilicon material 436 in a second trench 401-1.

Accordingly, the polysilicon material 436 may have a third height 415 (e.g., a first thickness) above the metallic material 406 in the first trench 407-1 and may have a fourth height 427 (e.g., a second thickness that is reduced relative to the first thickness) above the metallic material 406 in the second trench 401-1. The first thickness 415 and the second thickness 427 may respectively correspond to isolation areas and active areas of individual trenches (e.g., as shown in trench 407-1) and/or of adjacent trenches (e.g., as shown in trench 407-1 adjacent to trench 401-1). Hence, the first thickness 415 of the polysilicon material 436 formed over (e.g., on) the metallic material 406 in the first trench 407-1 may be greater than 419 the second thickness 427 of the polysilicon material 436 formed over (e.g., on) the metallic material 406 in the second trench 401-1. The greater thickness 419 of the polysilicon material 436 in the first trench 407-1 relative to the polysilicon material 436 in the second trench 401-1 may be in a range of from around 20 nm to around 50 nm, similar to the differences 425 and 428 of the bottoms of the trenches and the metallic material 406 described in connection with FIGS. 4A and 4B, respectively. The trenches 407 and 401 may be filled to the working surface 409 with a fill material (not shown) formed over the polysilicon material 436. The fill material may, in a number of embodiments, correspond to the mask material 138 shown and described in connection with FIG. 1.

Alternatively stated, the polysilicon material 436 may be formed over the metallic material 406 in the first trench 407-1 to a first depth greater than 419, relative to a corresponding height in the semiconductor substrate material 424, a second depth of the polysilicon material 436 formed over the metallic material 406 in the second trench 401-1. As described regarding the greater thickness 419 of the polysilicon material 436 in the first trench 407-1 relative to the second trench 401-1, the greater first depth 419 of the polysilicon material 436 in the first trench 407-1, relative to the second depth of the polysilicon material 436 in the second trench 401-1, may be in a range of from around 20 nm to around 50 nm.

The greater first depth of the polysilicon material 436 formed in the first trench 407-1 may reduce transfer of charge by way of the metallic material 406 in the first trench 407-1. For example, the greater first depth of the polysilicon material in the first trench 407-1 may reduce the transfer of the charge from a storage node (e.g., as shown at 131 and described in connection with FIG. 1). Without the intervening greater depth of the polysilicon material 436, the charge may be transferred from storage node 131, selectably coupled via an active access line to an access device 102 in second trench 401-1, to the metallic material 406 in the first trench 407-1.

Embodiments of the semiconductor structure illustrated at 400 in FIGS. 4A-4E may include a first portion of the metallic material 406 and the polysilicon material 436 in the first trench 407-1 that is configured to operate as a passing access line of an isolation area. For example, the first portion in the first trench 407-1 may substantially correspond to having widths above the bottom of portions of the first trench 407-1 shown at 408-1 and 408-4. The isolation area may have a depth of 150 nm or greater below the working surface 409, a width of 15 nm or less, and an AR of 10:1 or greater. An adjacent second portion of the metallic material 406 and the polysilicon material 436 in the second trench 401-1 may be, of may include, a hybrid metal gate of an active access line, in an active area, for an access device coupled to a sense line (e.g., as described in connection with FIG. 1). For example, the second portion in the first trench 407-1 may substantially correspond to having widths above the bottom of portions of the first trench 407-1 shown at 408-2 and 408-3, which would correspond to widths above the bottom portions of trenches 401-1 and 401-N shown at 408-5 and 408-6). The active area may have a depth of less than 150 nm below the working surface 409, a width of 15 nm or less, and an AR of less than 10:1.

As such, as best visualized in trench 407-1, each of the first and second trenches 407, 401 may include at least one first portion of the metallic material 406 and the polysilicon material 436 configured to operate as a passing access line. In addition, each of the first and second trenches 407, 401 may include at least one second portion of the metallic material 406 and the polysilicon material 436 configured to operate as an active access line for an access device coupled to a sense line and to a storage node.

Figure 5:
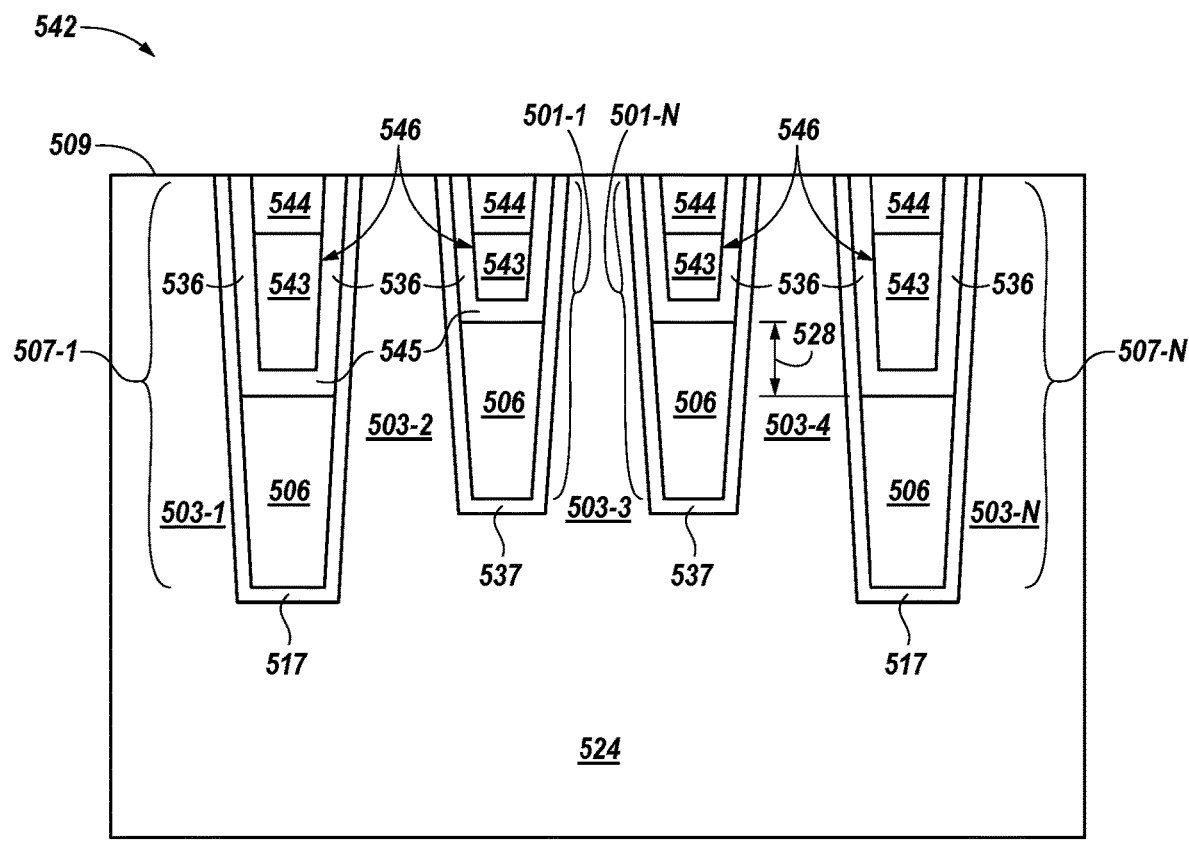
FIG. 5 illustrates an example cross-sectional view of a portion of another semiconductor structure formed in accordance with a number of embodiments of the present disclosure.

FIG. 5 illustrates an example cross-sectional view of a portion of another semiconductor structure 542 formed in accordance with a number of embodiments of the present disclosure. In contrast to FIGS. 4A-4E, FIG. 5 shows a two-dimensional cutaway view of a portion of an example semiconductor structure 542 that may correspond to axes x and z of the orientation indicator 420 shown in FIGS. 4A-4E.

As in FIGS. 4A-4E and elsewhere herein, semiconductor structure 542 shows two trenches 507-1 and 507-N that have first portions designed to operate as isolation areas by being formed (e.g., etched) deeper into the semiconductor substrate material 524 than two trenches 501-1 and 501-N that have second portions, adjacent to the first portions in trenches 507, designed to operate as active areas. The shallower active areas of the two trenches 501-1 and 501-N are shown in FIGS. 4A-4E and 5, and elsewhere herein, as being positioned adjacent each other such that the positioning of the portions in an intersecting plane is isolation area-active area-active area-isolation area. However, embodiments of the present disclosure are not so limited. For example, the positioning of the portions may alternate, as in isolation area-active area-isolation area-active area, or in various other positionings of the portions between pillars 503-1, . . . 503-N.

Each of the portions of trenches 507 and 501 may have a first metallic material 506 formed (e.g., deposited) to a first height in the deeper portions of trenches 507 designed to operate as isolation areas that is less than 528, relative to a corresponding height in the semiconductor substrate material 524, a second height of the first metallic material 506 in the shallower portions of trenches 501 designed to operate as active areas. The first metallic material 506, in a number of embodiments, may be, or may include, W and/or TiN, among other suitably conductive metallic materials.

A polysilicon material 536 may be formed (e.g., deposited) over (e.g., on) the first metallic material 506 in trenches 507 and 501. Conforming to the first height of the first metallic material 506 in trenches 507 being less than 528 the second height of the first metallic material 506 in trenches 501, the polysilicon material 536 may have a first depth in trenches 507 that is deeper than a second depth in trenches 501. As described herein, the difference 528 in the first and second heights of the first metallic material 506 and/or the first and second depths of the polysilicon material 536 may be in a range of from around 20 nm to around 50 nm. The polysilicon material 536, in a number of embodiments, may be, or may include, an n-doped polycrystalline silicon. The first metallic material 506 and the polysilicon material 536 may, in a number of embodiments, be deposited over (e.g., on) the dielectric material 517 of the isolation areas of trenches 507 and the gate dielectric material 537 of the active areas of trenches 501 (e.g., as described in connection with FIGS. 1 and 3A).

The polysilicon material 536 in each of the trenches 507 and 501 may be formed to include a recess 546. The recess 546 may, in a number of embodiments, be formed by depositing the polysilicon material 536 using a conformal deposition technique and/or by using an etch technique on previously deposited polysilicon material 536.

A second metallic material 543 may be formed (e.g., deposited) to at least partially fill the recess 546 in the polysilicon material 536 in the trenches 507 and 501. A bottom 545 of the recess 546 in the trenches 507 and 501 may be formed to have a configuration (e.g., shape, depth, thickness, etc.) that separates the first metallic material 506 from the second metallic material 543. Due to the polysilicon material 536 in trenches 501 being less deep than the polysilicon material 536 in trenches 507, the second metallic material 543 in trenches 501 may have a first depth less than, relative to the working surface 509, a second depth of the polysilicon material 536 in trenches 507. The second metallic material 543, in a number of embodiments, may be, or may include, ruthenium (Ru) and/or platinum (Pt), among other suitably conductive metallic materials.

In a number of embodiments, the second metallic material 543 may be formed in the recess 546 over (e.g., on) the polysilicon material 536 to a height that does not fill the recess 546 and/or the trench 501, 507 (e.g., to a level of the working surface 509). In such a situation, a fill material 544 may be used to fill a remainder of the recess 546 and/or the trench 501, 507. The fill material may, in a number of embodiments, correspond to the mask material 138 shown and described in connection with FIG. 1 and/or the fill material described in connection with FIG. 4E.

The second metallic material 543 in the first and second portions of the trenches 501, 507 may have a work function substantially equal to that of the polysilicon material 536 and a resistivity lower than that of the polysilicon material 536. As used herein, "work function" is intended to mean an amount (e.g., a minimum amount) of thermodynamic work (e.g., energy) used for movement of an electron from a solid surface to a point in a vacuum outside the solid surface on an atomic scale. "Resistivity" is intended to mean a measure of a resisting power of a specified material to flow of an electrical current. As such, the second metallic material 543 may be used to reduce a resistance along a length (e.g., corresponding to the y axis of the orientation indicator 420 shown in FIGS. 4A-4E) of the respective first and second portions of the trenches. For example, the second metallic material 543 in the recess 546 of the polysilicon material 536 may reduce an increased resistance along the length that is associated with (e.g., results from or is caused by) transition of direction of electrical current around differing depths of the first metallic material 506 and/or around differing depths of the polysilicon material 536 in the trenches 501, 507.

Figure 6:
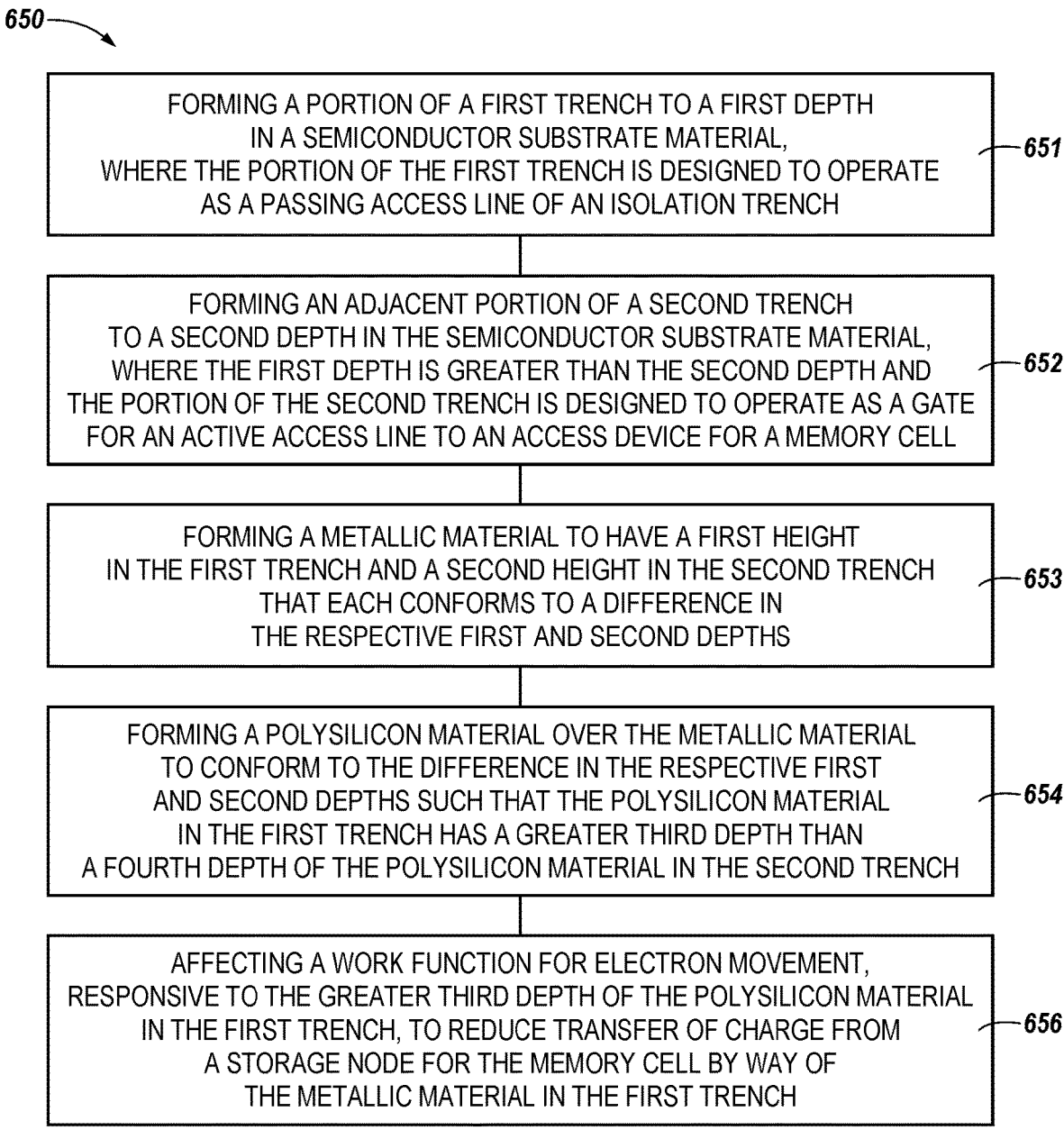
FIGS. 6-7 are flow diagrams of example methods for fabricating semiconductor structures in accordance with a number of embodiments of the present disclosure.

FIG. 6 is a flow diagram of an example method 650 for fabricating semiconductor structures in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 651, the method 650 may include forming a portion of a first trench to a first depth in a semiconductor substrate material, where the portion of the first trench is designed to operate as a passing access line of an isolation trench (e.g., as described with regard to the structural features and fabrication sequence in connection with FIGS. 1 and 4A-4E). At block 652, the method 650 may include forming an adjacent portion of a second trench to a second depth in the semiconductor substrate material, where the first depth is greater than the second depth and the portion of the second trench is designed to operate as a gate for an active access line to an access device for a memory cell (e.g., as described with regard to the structural features and fabrication sequence in connection with FIGS. 1 and 4A-4E). At block 653, the method 650 may include forming a metallic material to have a first height in the first trench and a second height in the second trench that each conforms to a difference in the respective first and second depths (e.g., as described with regard to the structural features and fabrication sequence in connection with FIGS. 4A and 4B). At block 654, the method 650 may include forming a polysilicon material over the metallic material to conform to the difference in the respective first and second depths such that the polysilicon material in the first trench has a greater third depth than a fourth depth of the polysilicon material in the second trench (e.g., as described with regard to the structural features and fabrication sequence in connection with FIGS. 4C-4E). At block 656, the method 650 may include affecting (e.g., raising) a work function for electron movement, responsive to the greater third depth of the polysilicon material in the first trench, to reduce transfer of charge from a storage node for the memory cell by way of the metallic material in the first trench.

Accordingly, the method 650 may, in a number of embodiments, further include reducing a probability of a change in a data value stored by the storage node, responsive to repeated access to the storage node (e.g., during a row hammer attack or otherwise), based on the reduced transfer of charge from the storage node. Alternatively or in addition, the method 650 may further include enabling a reduced frequency of data refresh operation performance for the storage node based on the reduced transfer of charge from the storage node.

The method 650 may further include forming the polysilicon material over the metallic material in the first trench and the second trench to not conform to the difference in the respective first and second depths such that a first height of the polysilicon material in the first trench is greater than, relative to the metallic material, a second height of the polysilicon material in the second trench (e.g., as described with regard to the structural features and fabrication sequence in connection with FIG. 4E). Accordingly, the method 650 may further include forming the polysilicon material over the metallic material such that a first height of a first upper surface of the polysilicon material in the first trench is substantially equal, relative to the semiconductor substrate material, to a second height of a second upper surface of the polysilicon material in the second trench (e.g., as described with regard to the structural features and fabrication sequence in connection with FIG. 4E).

The method 650 may further include forming the passing access line in a first opening of the first trench between a first pillar and a second pillar and forming the active access line in a second opening of the second trench between the second pillar and a third pillar (e.g., as described with regard to the structural features and fabrication sequence in connection with FIGS. 1 and 4A-4E). For example, a passing access line formed from the metallic material 406 and the polysilicon material 436 in an opening above bottom portion 408-4 in trench 407-1, as shown in FIG. 4A, may serve as an isolation area and an active access line formed from the metallic material 406 and the polysilicon material 436 in an opening of an adjacent portion of trench 401-1 may serve as an active area, as shown in FIG. 4E. The adjacent portions of the isolation area and the active area are shown as being separated by pillar 403-1 and in contact with the oxide material 417 and/or the spacer material 421 formed on the pillar 403-1.

The method 650 may further include forming (e.g., depositing) a nucleation film on a bottom of an opening and from a bottom portion to a top portion of sidewalls for the first trench and the second trench. The nucleation film deposited as such may enable reduction of a rate of deposition of the metallic material on an upper portion of the nucleation film formed on the sidewalls of the first and second trenches relative to a rate of deposition of the metallic material on a lower portion of the nucleation film. The metallic material may be formed to the first height in the first trench and to the second height in the second trench by deposition of the metallic material over the nucleation film. A probability of seam and/or void formation in the metallic material may thus be reduced during deposition of the metallic material in the first and second trenches. The reduced probability may be based on reduction of the rate of deposition of the metallic material on the upper portion of the nucleation film enabling a controlled deposition from a bottom portion to a top portion of the first and second trenches.

Such bottom-to-top deposition to suppress seam formation in a metal (i.e., W) may be performed using a Centura® iSprint® system available from Applied Materials®, Inc. Further information is provided in "improved tungsten gap-fill for advanced contact metallization" published in: 2016 IEEE International Interconnect Technology Conference/ Advanced Metallization Conference (IITC/AMC), Jul. 11, 2016 (electronic ISSN 2380-6338).

The method 650 may further include using an atomic layer deposition (ALD) technique to form the nucleation film by deposition of metallic material atoms to a thickness of less than 1 nm and using a CVD technique to fill the first trench with the metallic material to the first height and to fill the second trench with the metallic material to the second height with the reduced probability of seam and/or void formation. In a number of embodiments, the method 650 may further include filling the first trench with the metallic material to the first height and filling the second trench with the metallic material to the second height substantially simultaneously. The method 650 may further include using at least one of W and TiN for the nucleation film and the metallic material.

Figure 7:
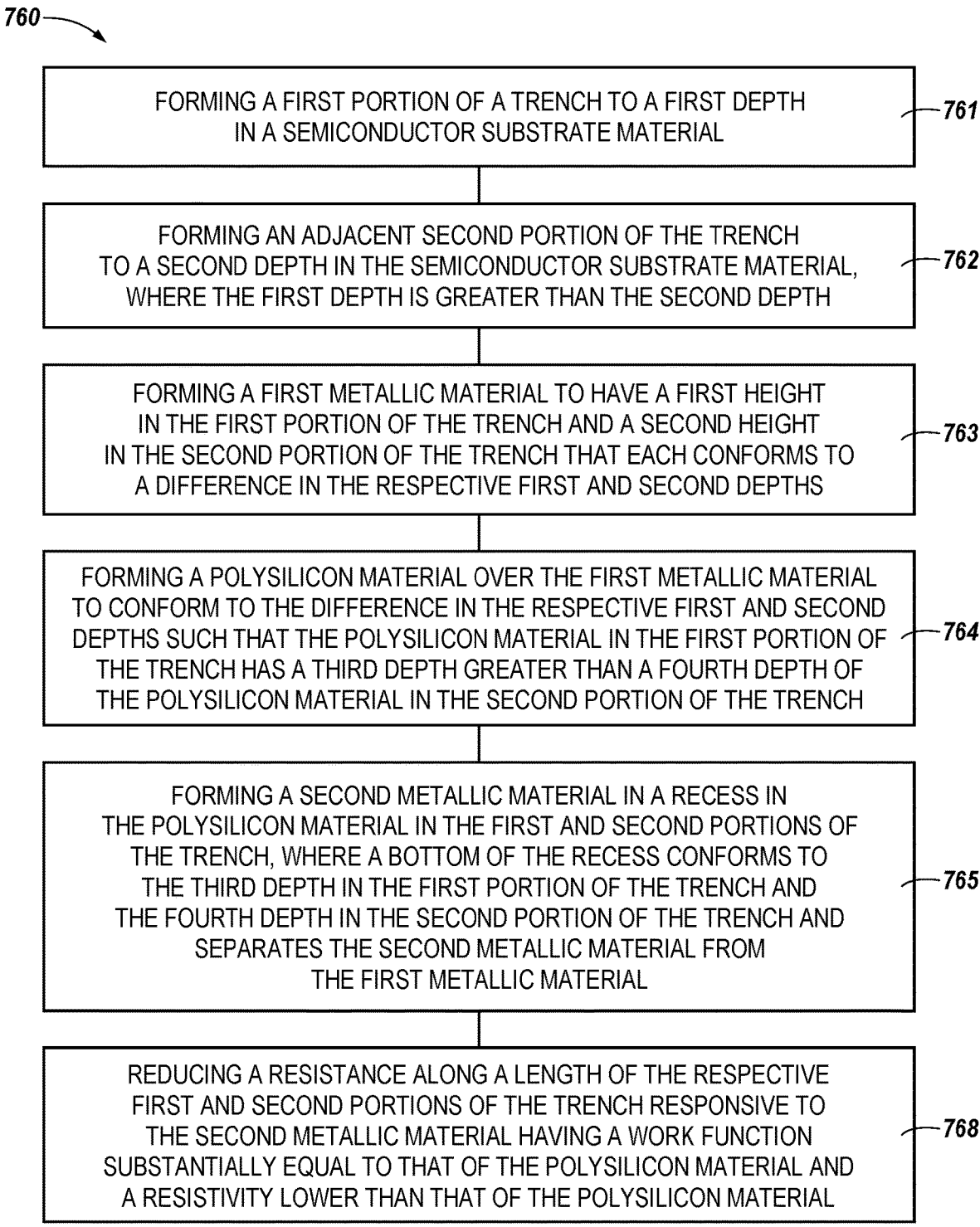

FIG. 7 is a flow diagram of an example method 760 for fabricating semiconductor structures in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time. The method elements shown in blocks 761, ..., 768, along with associated method elements, are described with regard to the structural features and fabrication sequence in connection with FIGS. 4A-4E and 5.

At block 761, the method 760 may include forming a first portion of a trench to a first depth in a semiconductor substrate material. At block 762, the method 760 may include forming an adjacent second portion of the trench to a second depth in the semiconductor substrate material, where the first depth is greater than the second depth. At block 763, the method 760 may include forming a first metallic material to have a first height in the first portion of the trench and a second height in the second portion of the trench that each conforms to a difference in the respective first and second depths. At block 764, the method 760 may include forming a polysilicon material over the first metallic material to conform to the difference in the respective first and second depths such that the polysilicon material in the first portion of the trench has a third depth greater than a fourth depth of the polysilicon material in the second portion of the trench. At block 765, the method 760 may include forming a second metallic material in a recess in the polysilicon material in the first and second portions of the trench, where a bottom of the recess conforms to the third depth in the first portion of the trench and the fourth depth in the second portion of the trench and separates the second metallic material from the first metallic material. At block 765, the method 760 may include reducing a resistance along a length of the respective first and second portions of the trench responsive to the second metallic material having a work function substantially equal to that of the polysilicon material and a resistivity lower than that of the polysilicon material.

The method 760 may further include reducing an increased resistance along the length associated with transition of direction of electrical current around the difference in the respective first and second depths of the first metallic material and around a difference in the third depth and the fourth depth of the polysilicon material. The method 760 may further include tuning a thickness of a wall and the bottom of the recess in the polysilicon material in the first and second portions of the trench such that a work function of the polysilicon material substantially equals a work function of a selected second metallic material. The thickness of the wall and the bottom of the recess in the polysilicon material may, in a number of embodiments, be tuned in a range of from around 1 nm to around 10 nm. The method 760 may further include using at least one of W and TiN for the first metallic material, using an n-doped polycrystalline silicon for the polysilicon material, and using at least one of Ru and Pt for the second metallic material.

The method 760 may further include forming the first portion of the trench to operate as a passing access line of an isolation trench. The method 760 may further include forming the second portion of the trench to operate as a gate for an active access line to an access device for a memory cell.

Figure 8:
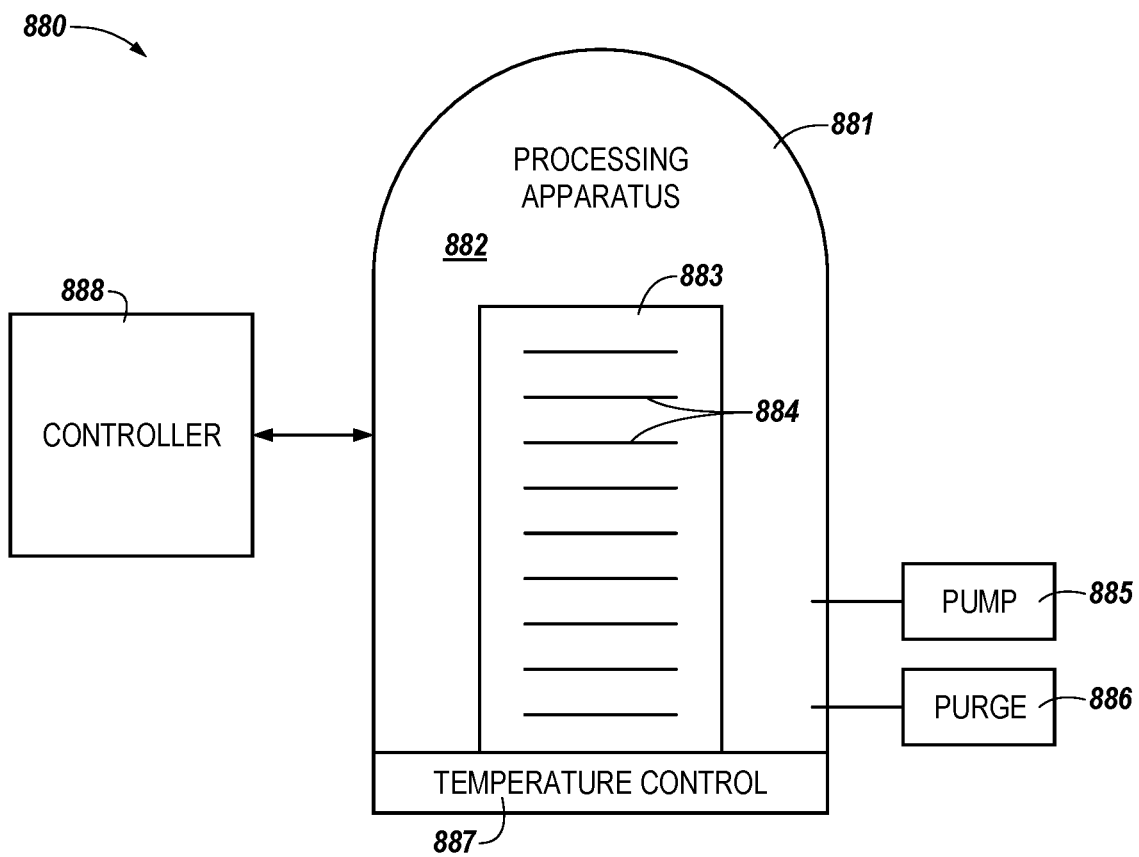
FIG. 8 is a functional block diagram of a system for implementation of an example semiconductor fabrication process in accordance with a number of embodiments of the present disclosure.

FIG. 8 is a functional block diagram of a system 880 for implementation of an example semiconductor fabrication process in accordance with a number of embodiments of the present disclosure. FIG. 8 illustrates an example processing apparatus 881 that may be used in a semiconductor fabrication process. The processing apparatus 881 may include a chamber 882 to enclose components configured to perform deposition and/or etch operations on a number of semiconductor devices. The chamber 882 may further enclose a carrier 883 to hold a batch of semiconductor wafers 884. The processing apparatus 881 may include and/or be associated with tools including, for example, a pump 885 unit and a purge 886 unit configured to introduce and remove appropriate etch chemistries, as described herein, at each point in the semiconductor fabrication sequence. The processing apparatus 881 may further include a temperature control 887 unit configured to maintain the chamber 882 at an appropriate temperature at each of the points in the fabrication sequence. The system 880 may include a number of chambers 882 that are each configured to perform particular processes (e.g., a wet etch process, a dry etch process, and/or a deposition process, among others) during the fabrication sequence.

The system 880 may further include a controller 888. The controller 888 may include, or be associated with, circuitry and/or programming for implementation of, for instance, forming a dielectric material in a trench to a passing access line. The dielectric material has a bias opposing a conductivity of a channel region to a neighboring access device. Adjustment of such deposition, removal, and etching operations by the controller 888 may control the critical dimensions (CDs) of the semiconductor devices created in the processing apparatus 881.

A host may be configured to generate instructions related to semiconductor structure formation (e.g., deposition and etching). An example of a host is shown at 958 in FIG. 9, although embodiments are not limited to being coupled to the memory system 962 shown in FIG. 9. The instructions may be sent via a host interface 960 to the controller 888 of the processing apparatus 881. The instructions may be based at least in part on scaled preferences (e.g., in numerically and/or structurally defined gradients) stored by the host 958, provided via input from another storage system (not shown), and/or provided via input from a user (e.g., a human operator), among other possibilities. The controller 888 may be configured to enable input of the instructions and scaled preferences to define the CDs of the fabrication of the semiconductor structure to be implemented by the processing apparatus 881.

The scaled preferences may determine final structures (e.g., the CDs) the pillars, a sidewalls of the pillars, a width of the pillars, a width of the isolation trench, and/or a depth of the isolation trench, along with positioning and/or amounts of the dielectric materials described herein, among other components and operations. Particular CDs may be enabled by the particular scaled preferences that are input via the instructions. Receipt and implementation of the scaled preferences by the controller 888 may result in corresponding adjustment, by the processing apparatus 881, of a deposition time for the dielectric materials, adjustment of a coverage area, height, and/or volume of the dielectric materials, and/or adjustment of a trim direction and/or trim time performed on the dielectric materials, among implementation of other possible scaled preferences.

The controller 888 may, in a number of embodiments, be configured to use hardware as control circuitry. Such control circuitry may, for example, be an application specific integrated circuit (ASIC) with logic to control fabrication steps, via associated deposition and etch processes, for pillar formation adjacent an isolation trench, along with formation of dielectric materials on and removal of the dielectric materials from the pillar and the isolation trench. The controller 888 may be configured to receive the instructions and direct performance of operations to perform semiconductor structure and/or isolation trench fabrication methods as described in connection with FIGS. 1-7.

FIG. 9 is a functional block diagram of a computing system 990 including at least one memory system 962 in accordance with one or more embodiments of the present disclosure. The numbering convention used in connection with FIG. 9 does not follow the earlier introduced numbering convention and sequence that applies to FIGS. 1-8. Memory system 962 may be, for example, a solid-state drive (SSD).

In the embodiment illustrated in FIG. 9, memory system 962 includes a memory interface 964, a number of memory devices 968-1, . . . 968-N, and a controller 966 selectably coupled to the memory interface 964 and memory devices 968-1, . . . 968-N. Memory interface 964 may be used to communicate information between memory system 962 and another device, such as a host 958. Host 958 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, personal digital assistants (PDAs), memory card readers, interface hubs, and the like. Such a host 958 may be associated with fabrication operations performed on semiconductor devices and/or SSDs using, for example, a processing apparatus shown at 881 and described in connection with FIG. 8.

In a number of embodiments, host 958 may be associated with (e.g., include or be coupled to) a host interface 960. The host interface 960 may enable input of scaled preferences (e.g., in numerically and/or structurally defined gradients) to define, for example, critical dimensions (CDs) of a final structure or intermediary structures of a memory device (e.g., as shown at 968) and/or an array of memory cells (e.g., as shown at 970) formed thereon to be implemented by the processing apparatus 881 shown and described in connection with FIG. 8. The array includes trenches having an isolation areas and active areas formed according to embodiments described herein. The scaled preferences may be provided to the host interface 960 via input of a number of preferences stored by the host 958, input of preferences from another storage system (not shown), and/or input of preferences by a user (e.g., a human operator).

Memory interface 964 may be in the form of a standardized physical interface. For example, when memory system 962 is used for information (e.g., data) storage in computing system 990, memory interface 964 may be a serial advanced technology attachment (SATA) interface, a peripheral component interconnect express (PCIe) interface, or a universal serial bus (USB) interface, among other physical connectors and/or interfaces. In general, however, memory interface 964 may provide an interface for passing control, address, information, scaled preferences, and/or other signals between the controller 966 of memory system 962 and a host 958 (e.g., via host interface 960).

Controller 966 may include, for example, firmware and/or control circuitry (e.g., hardware). Controller 966 may be operably coupled to and/or included on the same physical device (e.g., a die) as one or more of the memory devices 968-1, . . . 968-N. For example, controller 966 may be, or may include, an ASIC as hardware operably coupled to circuitry (e.g., a printed circuit board) including memory interface 964 and memory devices 968-1, . . . 968-N. Alternatively, controller 966 may be included on a separate physical device that is communicatively coupled to the physical device (e.g., the die) that includes one or more of the memory devices 968-1, . . . 968-N.

Controller 966 may communicate with memory devices 968-1, . . . 968-N to direct operations to sense (e.g., read), program (e.g., write), and/or erase information, among other functions and/or operations for management of memory cells. Controller 966 may have circuitry that may include a number of integrated circuits and/or discrete components. In a number of embodiments, the circuitry in controller 966 may include control circuitry for controlling access across memory devices 968-1, . . . 968-N and/or circuitry for providing a translation layer between host 958 and memory system 962.

Memory devices 968-1, . . . 968-N may include, for example, a number of memory arrays 970 (e.g., arrays of volatile and/or non-volatile memory cells). For instance, memory devices 968-1, . . . 968-N may include arrays of memory cells, such as a portion of an example memory device structured to include sense line contacts. At least one array includes a transistor having a gate structure formed according to the embodiments disclosed herein. As will be appreciated, the memory cells in the memory arrays 970 of memory devices 968-1, . . . 968-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory device 968 may be formed on the same die. A memory device (e.g., memory device 968-1) may include one or more arrays 970 of memory cells formed on the die. A memory device may include sense circuitry 972 and control circuitry 974 associated with one or more arrays 970 formed on the die, or portions thereof. The sense circuitry 972 may be utilized to determine (sense) a particular data value (e.g., 0 or 1) that is stored at a particular memory cell in a row of an array 970. The control circuitry 974 may be utilized to direct the sense circuitry 972 to sense particular data values, in addition to directing storage, erasure, etc., of data values in response to a command from host 958 and/or host interface 960. The command may be sent directly to the control circuitry 974 via the memory interface 964 or to the control circuitry 974 via the controller 966.

The embodiment illustrated in FIG. 9 may include additional circuitry that is not illustrated so as not to obscure embodiments of the present disclosure. For example, memory device 968 may include address circuitry to latch address signals provided over I/O connectors through I/O circuitry. Address signals may be received and decoded by a row decoder and a column decoder to access a memory array 970. It will be appreciated that the number of address input connectors may depend on the density and/or architecture of memory devices 968 and/or memory arrays 970.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, substrate materials, structural materials, metallic materials, polysilicon materials, oxide materials, spacer materials, dielectric materials, etch techniques, deposition techniques, access devices, active access lines, passing access lines, memory devices, memory cells, storage nodes, trenches, and openings, among other materials and/or components related to semiconductor structure formation, have been illustrated and described herein, embodiments of the present disclosure are not limited to those combinations explicitly recited herein. Other combinations and configurations of the semiconductor materials, substrate materials, structural materials, metallic materials, polysilicon materials, oxide materials, spacer materials, dielectric materials, etch techniques, deposition techniques, access devices, active access lines, passing access lines, memory devices, memory cells, storage nodes, trenches, and/or openings related to semiconductor structure formation than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. For example, proportions of the elements illustrated in FIGS. 1-5 are shown for clarity and may not be to scale. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a first trench having a first depth and a second trench having a second depth lesser than the first depth formed in a semiconductor substrate material, wherein the first and second trenches are adjacent and separated by the semiconductor substrate material;
   a first metallic material formed to a first height in the first trench that is less than, relative to the semiconductor substrate material, a second height of the first metallic material formed in the second trench;
   a polysilicon material formed over the first metallic material in the first trench to conform to the difference in the respective first and second depths such that the polysilicon material in the first trench has a third depth greater than, relative to the semiconductor substrate material, a fourth depth of the polysilicon material formed over the first metallic material in the second trench; and
   a second metallic material formed in a recess in the polysilicon material in the first and second trenches, wherein a bottom of the recess conforms to the third depth in the first trench and the fourth depth in the second trench and separates the second metallic material from the first metallic material;
   wherein the greater third depth of the polysilicon material formed in the first trench reduces transfer of charge by way of the first metallic material in the first trench, and wherein a bottom surface of the polysilicon material in the first trench is lower than a top surface of the first metallic material in the second trench and higher than a bottom surface of the first metallic material in the second trench.

2. The apparatus of claim 1, wherein:
   an access device in the second trench is selectably coupled to a storage node; and
   the greater third depth of the polysilicon material in the first trench reduces the transfer of the charge from the storage node.

3. The apparatus of claim 2, wherein the access device is a buried recessed access device (BRAD) that is part of a dynamic random access memory (DRAM) array.

4. The apparatus of claim 1, wherein:
   a first portion of the first metallic material and the polysilicon material in the first trench comprises a passing access line of an isolation area, wherein the isolation area has a depth of 150 nanometers (nm) or greater, a width of 15 nm or less, and an aspect ratio of ten to one (10:1) or greater; and
   an adjacent second portion of the first metallic material and the polysilicon material in the second trench comprises a hybrid metal gate of an active access line, in an active area, for an access device coupled to a sense line, wherein the active area has a depth of less than 150 nm, a width of 15 nm or less, and an aspect ratio of less than 10:1.

5. The apparatus of claim 1, wherein each of the respective first and second trenches comprises:
   a first portion of the first metallic material and the polysilicon material configured to operate as a passing access line; and
   a second portion of the first metallic material and the polysilicon material configured to operate as an active access line for an access device coupled to a sense line and to a storage node.

6. The apparatus of claim 1, wherein the first metallic material comprises tungsten.

7. The apparatus of claim 1, wherein the first metallic material comprises titanium nitride.

8. The apparatus of claim 1, wherein the polysilicon material comprises an n-doped polycrystalline silicon.

9. The apparatus of claim 1, wherein:
   the first trench has a first bottom at a greater depth relative to a second bottom of the second trench and the greater depth is in a range of from 20 nanometers (nm) to 50 nm;
   the first metallic material has a substantially equal height above the bottom of each of the first and second trenches such that a height of a top surface of the first metallic material in the first trench is less than a height of the top surface of the first metallic material formed in the second trench; and
   the greater third depth of the polysilicon material in the first trench, relative to the second depth of the polysilicon material in the second trench, is in a range of from 20 nm to 50 nm.

10. The apparatus of claim 1, wherein:
    a first thickness of the polysilicon material over the first metallic material in the first trench is greater than a second thickness of the polysilicon material over the first metallic material in the second trench and the greater thickness is in a range of from 20 nm to 50 nm;
    a first height of a top surface of the polysilicon material in the first trench is substantially equal, relative to the semiconductor substrate material, to a height of a top surface of the polysilicon material in the second trench; and
    the first and second trenches each comprises a fill material formed over the polysilicon material.

11. A method for semiconductor structure formation, comprising:
    forming a portion of a first trench to a first depth in a semiconductor substrate material, wherein the portion of the first trench is designed to operate as a passing access line of an isolation trench;
    forming an adjacent portion of a second trench to a second depth in the semiconductor substrate material, wherein:
       the first depth is greater than the second depth; and
       the portion of the second trench is designed to operate as a gate for an active access line to an access device for a memory cell;
    forming a first metallic material to have a first height in the first trench and a second height in the second trench that each conforms to a difference in the respective first and second depths;
    forming a polysilicon material over the first metallic material to conform to the difference in the respective first and second depths such that the polysilicon material in the first trench has a greater third depth than a fourth depth of the polysilicon material in the second trench, and
    wherein a bottom surface of the polysilicon material in the first trench is lower than a top surface of the first metallic material in the second trench and higher than a bottom surface of the first metallic material formed in the second trench;
    forming a second metallic material in a recess in the polysilicon material in the first and second trenches, wherein a bottom of the recess conforms to the third depth in the first trench and the fourth depth in the second trench and separates the second metallic material from the first metallic material; and
    affecting a work function for electron movement, responsive to the greater third depth of the polysilicon material in the first trench, to reduce transfer of charge from a storage node for the memory cell by way of the first metallic material in the first trench.

12. The method of claim 11, further comprising forming the polysilicon material over the first metallic material in the first trench and the second trench to not conform to the difference in the respective first and second depths such that a first height of the polysilicon material in the first trench is greater than, relative to the first metallic material, a second height of the polysilicon material in the second trench.

13. The method of claim 11, further comprising forming the polysilicon material over the first metallic material such that a first height of a first upper surface of the polysilicon material in the first trench is substantially equal, relative to the semiconductor substrate material, to a second height of a second upper surface of the polysilicon material in the second trench.

14. The method of claim 11, further comprising reducing a probability of a change in a data value stored by the storage node, responsive to repeated access to the storage node, based on the reduced transfer of charge from the storage node.

15. The method of claim 11, further comprising enabling a reduced frequency of data refresh operation performance for the storage node based on the reduced transfer of charge from the storage node.

16. The method of claim 11, further comprising:
forming the passing access line in a first opening of the first trench between a first pillar and a second pillar; and
forming the active access line in a second opening of the second trench between the second pillar and a third pillar.

17. The method of claim 16, further comprising:
using at least one of silicon (Si), poly-Si, amorphous Si, and doped Si for the pillars; and
using at least one of Si, poly-Si, and amorphous Si for the semiconductor substrate material.

18. The method of claim 11, further comprising:
forming a nucleation film on a bottom of an opening and from a bottom portion to a top portion of sidewalls for the first trench and the second trench;
reducing a rate of deposition of the first metallic material on an upper portion of the nucleation film formed on the sidewalls of the first and second trenches relative to a rate of deposition of the first metallic material on a lower portion of the nucleation film;
forming the first metallic material to the first height in the first trench and the second height in the second trench by deposition of the first metallic material over the nucleation film; and
reducing a probability of seam formation in the first metallic material during deposition of the first metallic material in the first and second trenches based on reduction of the rate of deposition of the first metallic material on the upper portion of the nucleation film enabling a controlled deposition from a bottom portion to a top portion of the first and second trenches.

19. The method of claim 11, further comprising using at least one of tungsten and titanium nitride for the nucleation film and the first metallic material.

20. The method of claim 19, further comprising:
using an atomic layer deposition (ALD) technique to form the nucleation film by deposition of first metallic material atoms to a thickness of less than 1 nanometer (nm); and
using a chemical vapor deposition (CVD) technique to fill the first trench with the first metallic material to the first height and to fill the second trench with the first metallic material to the second height.

21. A method for semiconductor structure formation, comprising:
forming a first portion of a trench to a first depth in a semiconductor substrate material;
forming an adjacent second portion of the trench to a second depth in the semiconductor substrate material, wherein the first depth is greater than the second depth;
forming a first metallic material to have a first height in the first portion of the trench and a second height in the second portion of the trench that each conforms to a difference in the respective first and second depths;
forming a polysilicon material over the first metallic material to conform to the difference in the respective first and second depths such that the polysilicon material in the first portion of the trench has a third depth greater than a fourth depth of the polysilicon material in the second portion of the trench;
forming a second metallic material in a recess in the polysilicon material in the first and second portions of the trench, wherein a bottom of the recess conforms to the third depth in the first portion of the trench and the fourth depth in the second portion of the trench and separates the second metallic material from the first metallic material, wherein a bottom surface of the polysilicon material in the first portion of the trench is lower than a top surface of the metallic material in the second portion of the trench and higher than a bottom surface of the metallic material in the second portion of the trench; and
reducing a resistance along a length of the respective first and second portions of the trench responsive to the second metallic material having a work function substantially equal to that of the polysilicon material and a resistivity lower than that of the polysilicon material.

22. The method of claim 21, further comprising reducing an increased resistance along the length associated with transition of direction of electrical current around the difference in the respective first and second depths of the first metallic material and around a difference in the third depth and the fourth depth of the polysilicon material.

23. The method of claim 21, further comprising:
forming the first portion of the trench to operate as a passing access line of an isolation trench; and
forming the second portion of the trench to operate as a gate for an active access line to an access device for a memory cell.

24. The method of claim 21, further comprising:
using at least one of tungsten and titanium nitride for the first metallic material;
using an n-doped polycrystalline silicon for the polysilicon material; and
using at least one of ruthenium and platinum for the second metallic material.

25. The method of claim 21, further comprising tuning a thickness of a wall and the bottom of the recess in the polysilicon material in the first and second portions of the trench such that a work function of the polysilicon material substantially equals a work function of a selected second metallic material.

* * * * *